US012685003B2

(12) United States Patent     (10) Patent No.:   US 12,685,003 B2

Zhang et al.     (45) Date of Patent:     Jul. 14, 2026

(54) DISPLAY MODULE INCLUDING A COMPOSITE HEAT DISSIPATION LAYER WITH CRACK RELIEF OPENINGS AND DISPLAY DEVICE

(71) Applicant: Shanghai Tianma Micro-electronics Co., Ltd., Shanghai (CN)

(72) Inventors: Kaikai Zhang, Shanghai (CN); Yongxin He, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 669 days.

(21) Appl. No.: 18/203,480

(22) Filed: May 30, 2023

(65) Prior Publication Data

US 2024/0334798 A1     Oct. 3, 2024

(30) Foreign Application Priority Data

Mar. 30, 2023    (CN) ........................ 202310335116.X

(51) Int. Cl.
*H10K 59/80*     (2023.01)
*B32B 5/18*     (2006.01)
(Continued)

(52) U.S. Cl.
CPC ........... *H10K 59/8794* (2023.02); *B32B 5/18* (2013.01); *B32B 7/12* (2013.01); *B32B 15/046* (2013.01);
(Continued)

(58) Field of Classification Search
CPC .......... H10K 59/8794; B32B 3/04; B32B 5/18
See application file for complete search history.

(56) References Cited

U.S. PATENT DOCUMENTS

| | | | |
|---|---|---|---|
| 2023/0016706 A1* | 1/2023 | Hwang | ..................... G02B 1/14 |
| 2023/0107898 A1* | 4/2023 | Lee | ........................ G06F 1/1637 |
| | | | 361/807 |
| 2024/0365521 A1* | 10/2024 | Xiong | ................... G06F 1/1637 |

FOREIGN PATENT DOCUMENTS

| | | |
|---|---|---|
| CN | 111540279 A | 8/2020 |
| CN | 111627338 A | 9/2020 |

(Continued)

OTHER PUBLICATIONS

Torabi et al. ("Local strain energy density to predict mode II brittle fracture in Brazilian disk specimens weakened by V-notches with end holes" Mater. Des. 69 (2018) 22-29) (Year: 2018).*

*Primary Examiner* — Davienne N Monbleau
*Assistant Examiner* — Dmitri Mihaliov
(74) *Attorney, Agent, or Firm* — Anova Law Group, PLLC

(57) ABSTRACT

A display module and a display device are provided. The display module includes a display panel and a composite layer. The composite layer is located on a backlight side of the display panel and includes a heat dissipation layer. The display panel includes a planar region, curved regions and corner regions. The curved regions are partially arranged around the planar region and the corner regions are disposed at corners of the curved regions. In one corner region, the heat dissipation layer includes at least one opening. The corner region includes a first position and a second position. A width of the opening at the first position is smaller than the width of the opening. At the half length of the opening, the width D2 of the opening is smaller than half of the maximum width D1 of the opening.

19 Claims, 29 Drawing Sheets

(51) Int. Cl.
  *B32B 7/12* (2006.01)
  *B32B 15/04* (2006.01)

(52) U.S. Cl.
  CPC ....... *B32B 2307/30* (2013.01); *B32B 2457/20* (2013.01)

(56) References Cited

FOREIGN PATENT DOCUMENTS

| | | | |
|---|---|---|---|
| CN | 113450656 | A | 9/2021 |
| CN | 115181508 | A | 10/2022 |

* cited by examiner

DISPLAY MODULE INCLUDING A COMPOSITE HEAT DISSIPATION LAYER WITH CRACK RELIEF OPENINGS AND DISPLAY DEVICE

CROSS-REFERENCE TO RELATED APPLICATION

This application claims the priority of Chinese Patent Application No. 202310335116.X, filed on Mar. 30, 2023, the content of which is incorporated herein by reference in its entirety.

TECHNICAL FIELD

The present disclosure generally relates to the field of display technology and, more particularly, relates to a display module and a display device.

BACKGROUND

With the maturity of organic light-emitting diode (OLED) display technology, there are more and more flexible OLED display products. Curved screen design brought by the flexible OLEDs has improved the screen-to-body ratio qualitatively. The demand for OLED curved display modules is increasing. Therefore, more and more display devices adopt curved display panels to increase the screen-to-body ratio and bring a better visual experience to users.

Because of the increasing integration level and performance of display modules, heat generated during the working process of the display modules is increasing. Therefore, considering heat dissipation, shielding performance, and so on, a layer of heat dissipation composite material is bonded to dissipate the heat of and shield a display panel. However, copper foil is usually used in heat dissipation composite materials, and copper foil is made of a metal with high hardness and poor ductility. Therefore, when the heat dissipation composite material is attached to the curved display body, different bonding conditions will appear in different regions. For example, in the process of changing from a planar surface to a spatial curved surface, the film material is easily buckled when it is squeezed, and the attached heat dissipation film material is easy to separate from the display module, resulting in gaps, wrinkles, air bubbles, etc. Correspondingly, it cannot be tightly bonded, which not only seriously affects the bonding yield and product appearance of the product, but also easily causes water and oxygen to enter the display module from the gap, resulting in the failure of the display module.

Therefore, providing a display module and a display device that is able to reduce the probability of virtual bonding and wrinkles, improve product yield, and ensure display quality is a technical problem to be solved.

SUMMARY

One aspect of the present disclosure provides a display module. The display module includes a display panel and a composite layer. The composite layer is located on a backlight side of the display panel, and at least includes a heat dissipation layer. The display panel includes a planar region, a plurality of curved regions and a plurality of corner regions. The plurality of curved regions is at least partially arranged around the planar region and the plurality of corner regions is disposed at corners of the plurality of curved regions around the planar region. In one corner region of the plurality of corner regions, the heat dissipation layer includes at least one opening, and the at least one opening extends along a first direction. The corner region includes a first position and a second position located at a side of the first position away from the planar region. A width of the at least one opening in a second direction at the first position is smaller than a width of the at least one opening at the second position in the second direction, where the second direction is perpendicular to the first direction. A length of the at least one opening in the first direction is H; and at 1/2H, the width of the at least one opening in the second directions is D2, and the maximum width of the at least one opening in the second direction is D1; where D2<0.5D1.

Another aspect of the present disclosure provides a display device. The display device includes a display module. The display module includes a display panel and a composite layer. The composite layer is located on a backlight side of the display panel, and at least includes a heat dissipation layer. The display panel includes a planar region, a plurality of curved regions and a plurality of corner regions. The plurality of curved regions is at least partially arranged around the planar region and the plurality of corner regions is disposed at corners of the plurality of curved regions around the planar region. In one corner region of the plurality of corner regions, the heat dissipation layer includes at least one opening, and the at least one opening extends along a first direction. The corner region includes a first position and a second position located at a side of the first position away from the planar region. A width of the at least one opening in a second direction at the first position is smaller than a width of the at least one opening at the second position in the second direction, where the second direction is perpendicular to the first direction. A length of the at least one opening in the first direction is H; and at 1/2H, the width of the at least one opening in the second directions is D2, and the maximum width of the at least one opening in the second direction is D1; where D2<0.5D1.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
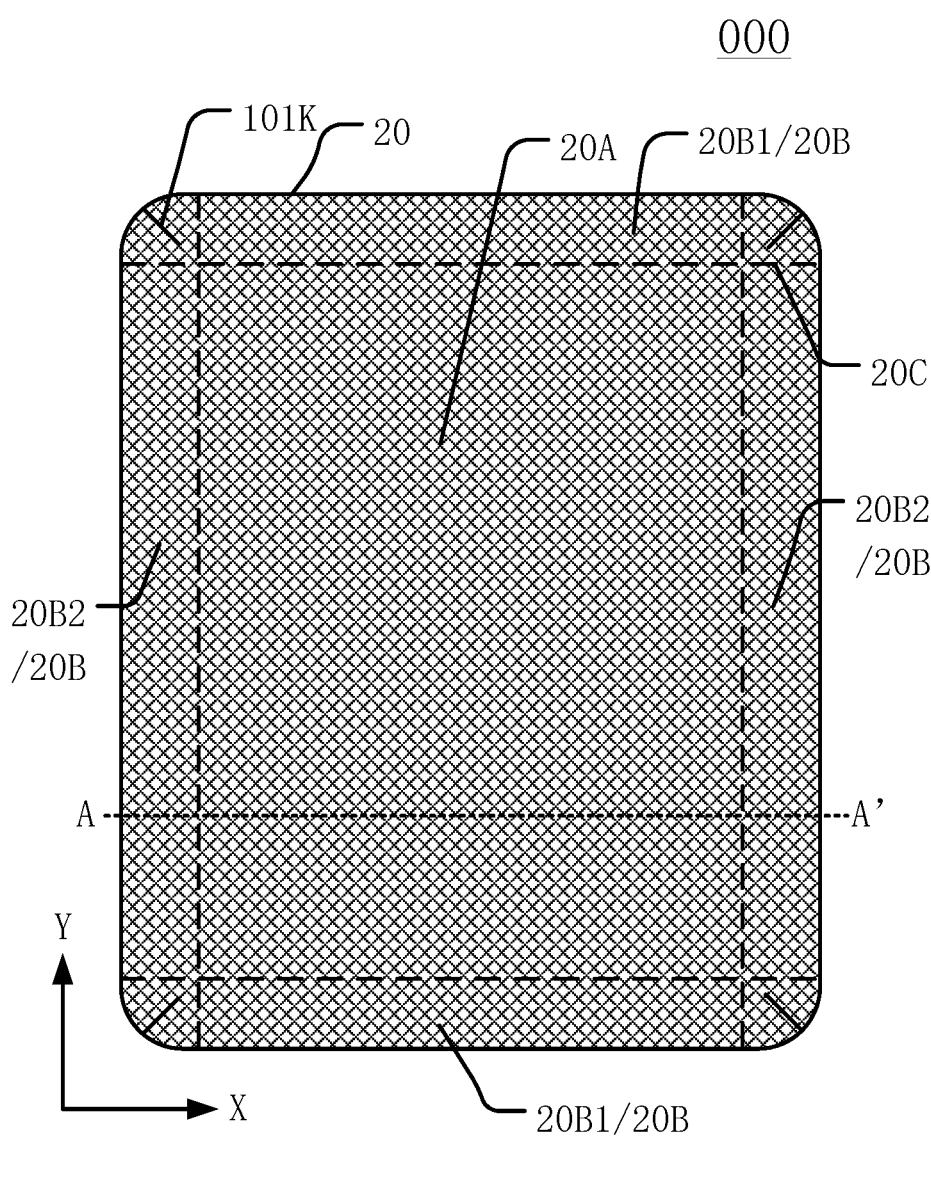
FIG. 1 illustrates a planar structure of a display module at a light-exiting side of a display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

Figure 2:
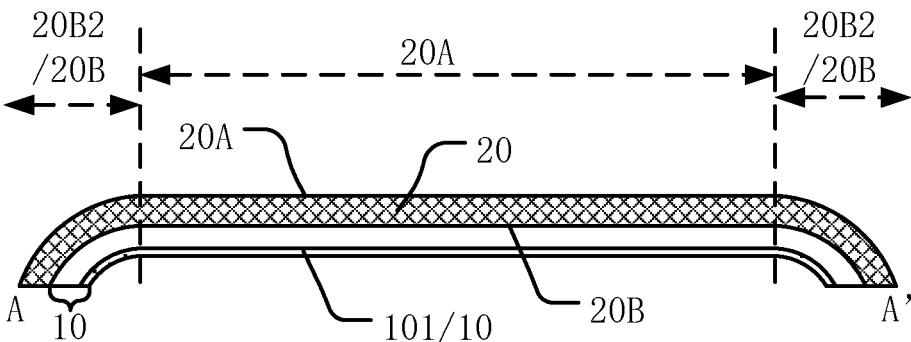
FIG. 2 illustrates a cross-sectional view along an AA' direction in FIG. 1, consistent with various disclosed embodiments of the present disclosure.
Figure 3:
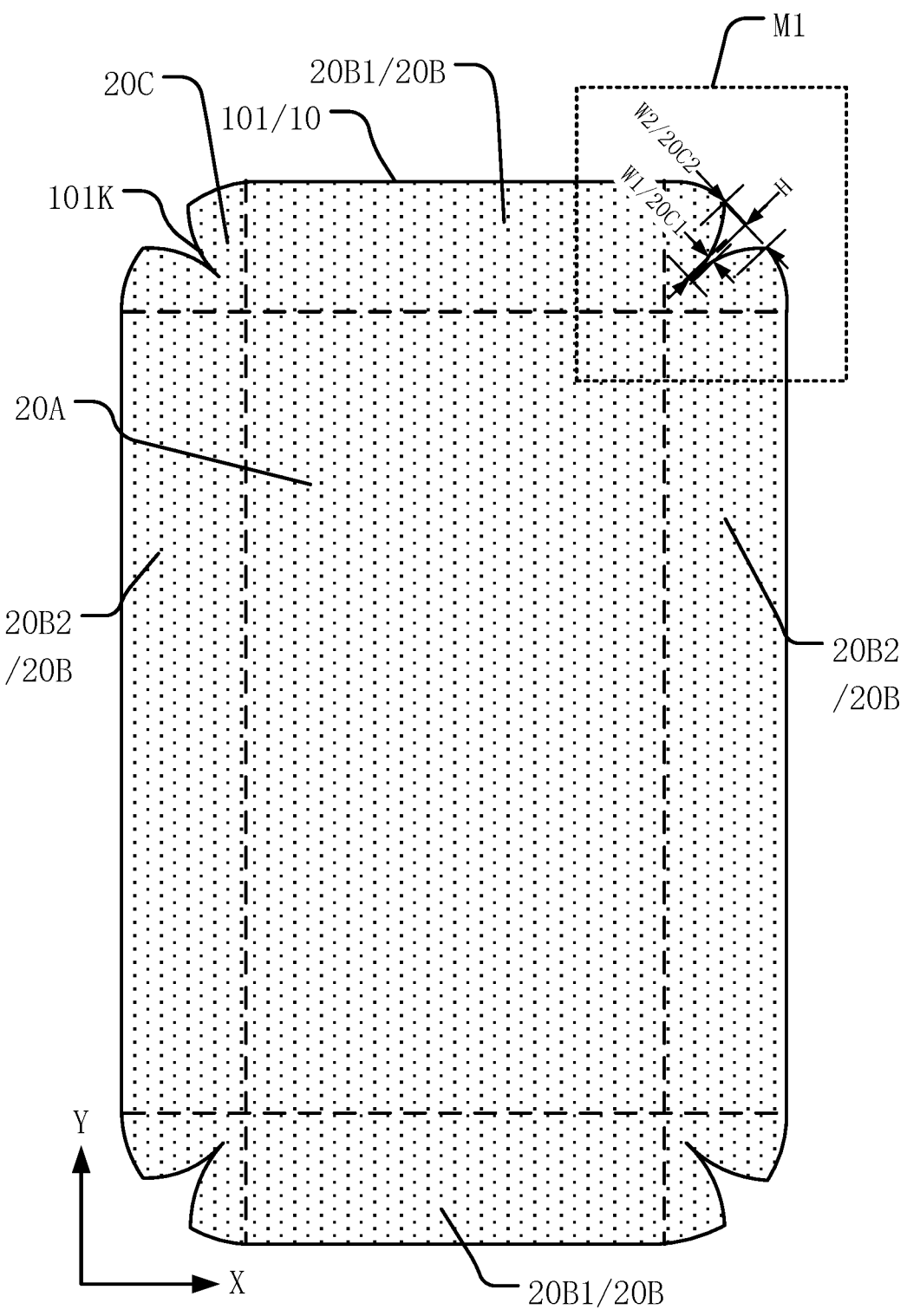
FIG. 3 illustrates a planar structure in FIG. 1 and FIG. 2 before a heat dissipation layer in a composite layer is bonded, consistent with various disclosed embodiments of the present disclosure.
Figure 4:
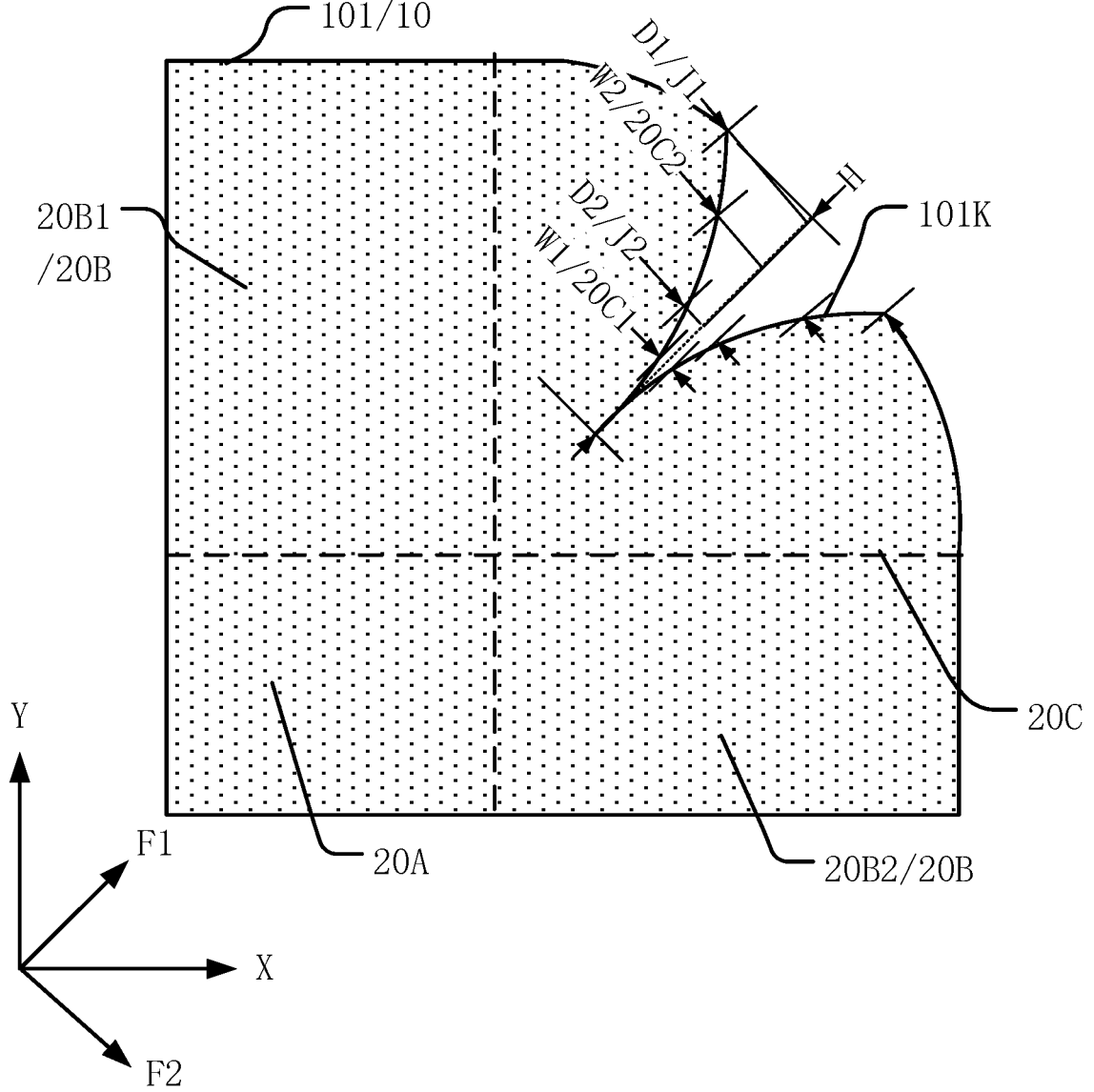
FIG. 4 illustrates a locally enlarged structure of an M1 region in FIG. 3, consistent with various disclosed embodiments of the present disclosure.
Figure 5:
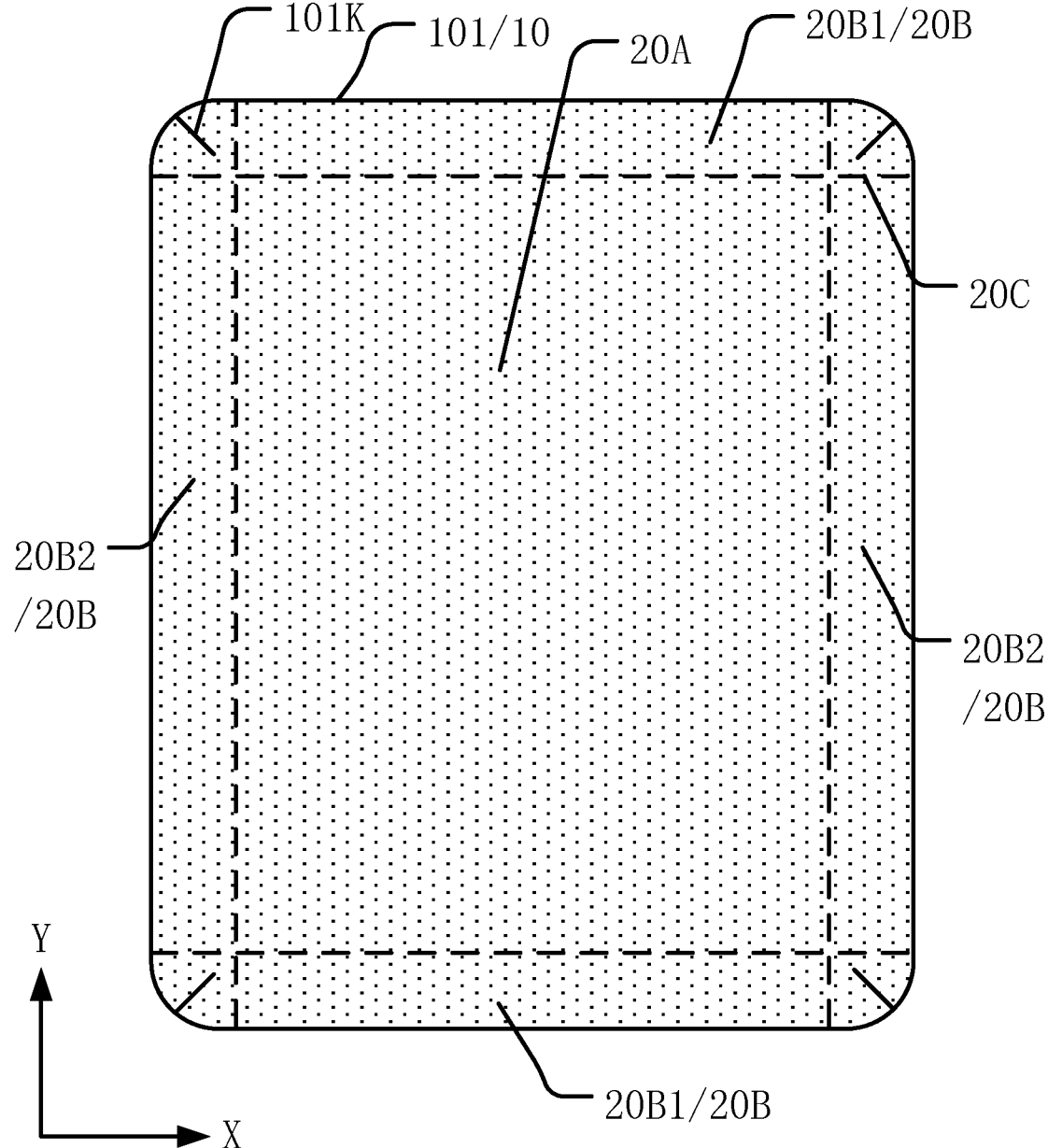
FIG. 5 illustrates a planar structure in FIG. 1 and FIG. 2 after a heat dissipation layer in a composite layer is bonded, consistent with various disclosed embodiments of the present disclosure.

The present disclosure provides a display module. FIG. 1 illustrates a planar structure of the display module at a light-exiting side of a display panel provided by one embodiment of the present disclosure. FIG. 2 illustrates a cross-sectional view along an AA' direction in FIG. 1. FIG. 3 illustrates a planar structure in FIG. 1 and FIG. 2 before a heat dissipation layer in a composite layer is bonded. FIG. 4 illustrates a locally enlarged structure of an M1 region in FIG. 3. FIG. 5 illustrates a planar structure in FIG. 1 and FIG. 2 after the heat dissipation layer in the composite layer is bonded. (To clearly illustrate the structure of this embodiment, FIG. 1 is filled with transparency to clearly illustrate the opening structure of the heat dissipation layer on the backlight side of the display panel, FIG. 3 illustrates the planar structure of the heat dissipation layer before the composite layer is bonded to the display panel, and FIG. 5 shows a schematic diagram of the planar structure of the heat dissipation layer after the composite layer is bonded to the display panel.) As shown in FIG. 1 to FIG. 5, in one embodiment, the display module 000 may include a display panel 20 and a composite layer 10. The composite layer 10 may be located on a side of a backlight surface 20B of the display panel 20. The composite layer 10 may at least include a heat dissipation layer 101. In one embodiment, the composite layer may be a composite tape layer.

The display panel 20 may include a planar region 20A, a plurality of curved regions 20B and a plurality of corner regions 20C. The plurality of curved regions 20B may be at least partially arranged around the planar region 20A, and the plurality of corner regions 20C may be arranged at corners of the plurality of curved regions 20B around the planar region 20A.

In the plurality of corner regions 20C, the heat dissipation layer 101 may include at least one opening 101K, and the at least one opening 101K may extend along a first direction F1.

One of the plurality of corner regions 20C may include a first position 20C1 and a second position 20C2 located at a side of the first position 20C1 away from the planar region 20A. A width W1 of the at least one opening 101K at the first position 20C1 in a second direction F2 may be smaller than a width W2 of the at least one opening 101K in the second direction F2 at the second position 20C2. The second direction F2 may be perpendicular to the first direction F1.

A length of the at least one opening 101K in the first direction F1 may be H. At a positon of 1/2H, a width of the at least one opening 101K in the second direction F2 may be D2, and the maximum width of the at least one opening 101K in the second direction F2 may be D1, where D2<0.5D1.

Specifically, the display module 000 may be a curved screen. The display module 000 may include the display panel 20 and the composite layer 10 located on the side of the backlight surface 20B of the display panel 20. The display panel 20 may be used to implement the display module 000. For display effect, the light-emitting surface 20A of the display panel 20 may be used to display images, and the light-emitting surface 20A of the display panel 20 and the backlight surface 20B of the display panel 20 may be two opposite surfaces of the display panel 20. The backlight surface 20B of the display panel 20 may be bonded with the composite layer 10. The composite layer 10 may be a multi-layer film material stacked structure. The composite layer 10 may play a certain supporting role for the display panel 20. The composite layer 10 may at least include the heat dissipation layer 101. Because of the improvement of the integration and performance of the display module 000, the heat generated during the operation of the display module 000 is increasing. Therefore, the composite layer 10 at least including the heat dissipation layer 101 may be bonded to the side of the backlight surface 20B of the display panel 20, to dissipate heat from the display panel 20 and shield interference signals when the display module 000 is in use, ensuring the display quality of the display module 000.

The display panel 20 may be a curved display panel. Optionally, in one embodiment, the display panel 20 may be a four-curved display screen. In the four-curved display screen, based on that the screen in the middle is a planar structure and the screens on the left and right sides are curved structures, the upper and lower sides of the central screen are also curved panels, that is, the four-curved display has curved surfaces in the four directions of up, down, left and right. Compared with the double-curved display screen, the four-curved display screen may be able to further improve the screen-to-body ratio of the screen, and the user's visual experience satisfaction may be improved. Specifically, the display panel 20 of this embodiment may include the planar region 20A, the plurality of curved regions 20B, and the plurality of corner regions 20C. The plurality of curved regions 20B may be at least partially arranged around the planar region 20A, and the plurality of corner regions 20C may be arranged at corners of the plurality of curved regions 20B around the planar region 20A. In one embodiment, the display panel 20 may include four curved regions 20B and four corner regions 20C, which will be used as an example for illustration. The plurality of corner regions 20C may be arranged at corners of the plurality of curved regions 20B around the planar region 20A. The plurality of curved regions 20B may include at least one first curved region 20B1 extending along the transverse direction X and at least one second curved region 20B2 extending along the longitudinal direction Y. Positions of intersections of the at least one first curved region 20B1 and the at least one second curved region 20B2 may be corners, that is, the positions of the plurality of corner regions 20C.

In existing technologies, metal foil such as copper foil is generally used as a material for the heat dissipation layer of the composite layer. Therefore, the heat dissipation layer generally has a relatively large elastic modulus, relatively thin thickness, and poor ductility. When the composite layer is attached to the planar region, the plurality of curved regions, and the plurality of corner regions on the backlight side of the display panel, different lamination conditions will occur in different regions. For example, when the heat dissipation layer is attached to the plane region of the display panel, the heat dissipation layer may be under force of a single direction, and the bonding difficulty may be small. When the heat dissipation layer is attached to one curved region of the plurality of curved regions of the display panel, the heat dissipation layer may be subjected to forces in two directions since the curved surface region is bent, and the bonding difficulty may be relatively low. When the heat dissipation layer is bonded to one corner region of the plurality of corner regions of the display panel, since the curved surface of the corner region is bent in a plurality of directions, the heat dissipation layer may be subjected to forces in the plurality of different directions when it is bonded, and may be easy to be squeezed by forces in the plurality of directions during the bonding process of the corner region. Therefore, the heat dissipation layer with poor ductility may buckle in the corner region, form wrinkles or air bubbles, etc., such that the heat dissipation layer in the corner region may not be tightly bonded to the display panel. The difficulty of bonding may be greatly increased, the product yield and appearance may be affected, and also the cooling effect and display quality in the plurality of corner regions may be affected.

In the present disclosure, in one corner region of the plurality of corner regions 20C of the display panel 000, the heat dissipation layer 101 may be provided with at least one opening 101K, and the at least one opening 101K may extend along the first direction F1. It can be understood that the first direction F1 is the extending direction of the at least one opening 101K. The at least one opening 101K may be understood as an opening structure recessed from the edge of the heat dissipation layer 101 to the center of the heat dissipation layer 101. The corner region 20C may include a first position 20C1 and a second position 20C2 located at the side of the first position 20C1 away from the planar region 20A. For example, when the second position 20C2 is understood as the edge position of the display panel 000 in the corner region 20C, the first position 20C1 may be understood as any position between the second position 20C2 and the planar region 20A within the range of the corner region 20C. Or the second position 20C2 may be understood as other positions, as long as the first position 20C1 is located at a side of the second position 20C2 close to the planar region 20A. Optionally, the first position 20C1 may be a point or a region, and the second position 20C2 may be a point or a region, which is not limited in this embodiment. In a specific structure of the at least one opening 101K opened in the heat dissipation layer 101 in the corner region 20C, the width W1 of the at least one opening 101K in the second direction F2 at the first position 20C1 may be smaller than the width W2 of the at least one opening 101K in the second direction F2 at the second position 20C2. The second The direction F2 may be perpendicular to the first direction F1, that is, the second reverse direction F2 may be understood as a direction perpendicular to the extending direction of the at least one opening 101K. The width W1 of the at least one opening 101K in the second direction F2 at the first position 20C1 of this embodiment may be configured to be smaller than the width W2 of the at least one opening 101K in the second direction F2 at the second position 20C2. Therefore, for the at least one opening 101K opened in the heat dissipation layer 101 in the corner region 20C, the width of the at least one opening 101K in the second direction F2 may be smaller when it is closer to the planar region 20A, and the width of the at least one opening 101K in the second direction F2 may be larger when it is farther away from the plane region 20A. Further, in the structure of the at least one opening 101K provided in this embodiment, the length of the at least one opening 101K in the first direction F1 (the direction in which it extends) may be H, and at a position of 1/2H, that is, at half the length of the at least one opening 101K (as shown by J2 in FIG. 4), the width of the at least one opening 101K in the second direction F2 may be D2, and D2 may be smaller than half of the maximum value D1 of the width of the at least one opening 101K in the second direction F2 (that is, D2<0.5D1). Since the width of the at least one opening 101K in the second direction F2 may be smaller when it is closer to the planar region 20A, the maximum value D1 of the width of the at least one opening 101K in the second direction F2 may be understood as the width of the at least one opening 101K in the edge position of the corner region 20C (that is, the position J1 in FIG. 4). In this embodiment, at the half-length position of the at least one opening 101K, the width D2 of the at least one opening 101K in the second direction F2 may be configured to be smaller than half of the maximum value D1 of the width of the at least one opening 101K in the second direction F2, such that the width of the at least one opening 101K in the second direction F2 may tend to become narrower at an accelerated rate in the first direction F1 and from the corner region 20C to the planar region 20A. Therefore, the edge of the at least one opening 101K formed by the heat dissipation layer 101 in the corner region 20C may be arc-shaped, and an orthographic projection of the at least one opening 101K to the light-emitting surface of the display module 000 may be a trumpet shape.

In the present embodiment, when the heat dissipation layer 101 is bonded to the backlight surface 20B of the display panel 20, the at least one opening 101K in the heat dissipation layer 101 in the corner region 20C may prevent the heat dissipation layer 101 in the corner region 20C from being squeezed by forces in different directions when the heat dissipation layer 101 is bonded to the display panel 20 in the corner region 20C. Even when the heat dissipation layer 101 has a large elastic modulus and poor ductility, the at least one opening 101K may still be able to prevent the occurrence of wrinkles or bubbles between the heat dissipation layer 101 and the display panel 20 when the heat dissipation layer 101 in the corner region 20C is bonded to the display panel 20, improving the bonding yield and reducing the difficulty of bonding. Moreover, after the heat dissipation layer 101 provided in this embodiment is bonded to the backlight surface 20B of the display panel 20, the arc-shaped edge of the at least one trumpet-shaped opening 101K in the corner region 20C may be able to follow the curved surface shape of the corner region 20C, such that the arc edges of the at least one opening 101K may be merged together as much as possible (as shown in FIG. 5), to avoid uneven heat dissipation in the corner region 20C of the display panel 20 because of the occurrence of gaps between the curved edges of the at least one opening 101K after the heat dissipation layer 101 is bonded to the display panel 20 in the corner region 20C. Therefore, the even heat dissipation of the display panel 20 in the corner region 20C may be effectively ensured after the heat dissipation layer 101 is attached to the display panel 20, thereby improving the display quality.

In existing technologies, the heat dissipation layer is provided with cross-shaped openings or V-shaped openings or other openings in shapes other than those provided by this embodiment in the corner region. After the heat dissipation layer with cross-shaped openings, V-shaped openings, or openings in other shapes, is bonded to the display panel, gaps still occur between the opening edges in the corner region and cannot be tightly closed together. Therefore, there are still regions in the corner region where the heat cannot be dissipated, or the opening edges overlap to form folds, inducing uneven heat dissipation. Although openings are also provided in the heat dissipation layer in the existing technologies, the bonding yield cannot be guaranteed, and the uniformity of heat dissipation cannot be guaranteed. In the display module 000 provided by this embodiment, the at least one trumpet-shaped opening 101K of the heat dissipation layer 101 in the corner region 20C may make the arc-shaped edges of the at least one opening 101K merge together as much as possible after bonding. That is, the arc-shaped edges of the at least one opening 101K may be forked before bonding (as shown in FIG. 3 and FIG. 4). After the heat dissipation layer 101 is bonded to the display panel 20, the arc-shaped edges of the at least one opening 101K may be seamlessly merged together (as shown in FIG. 5) and may neither overlap nor have gaps, ensuring the uniformity of heat dissipation in the corner region 20C.

The structure of the display module 000 in the previous embodiments is used as an example only to illustrate the present disclosure, and does not limit the scope of the present disclosure. In various embodiments, the structures of the display panel 20 and the composite layer 10 may be not limited to these, and may include other structures. For example, in another embodiment, the display panel 20 may include a display function layer, and the composite layer 10 may further include film materials other than the heat dissipation layer 101 which may be bonded to the backlight surface of the display panel 20 together. The composite layer 10 may further include other film layers between the heat dissipation layer 101 and the backlight surface 20B of the display panel 20.

Figure 6:
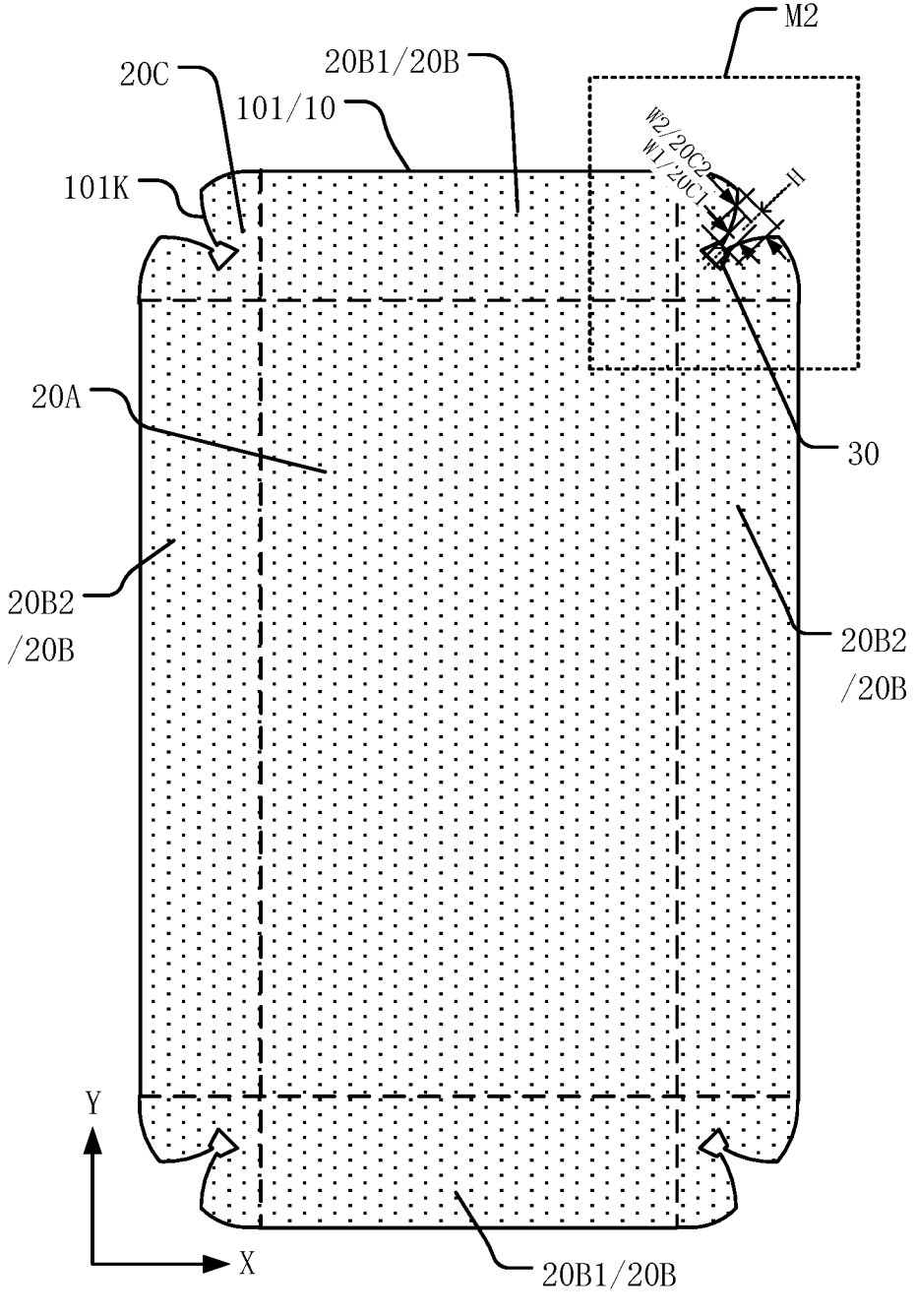
FIG. 6 illustrates another planar structure in FIG. 1 and FIG. 2 before a heat dissipation layer in a composite layer is bonded, consistent with various disclosed embodiments of the present disclosure.
Figure 7:
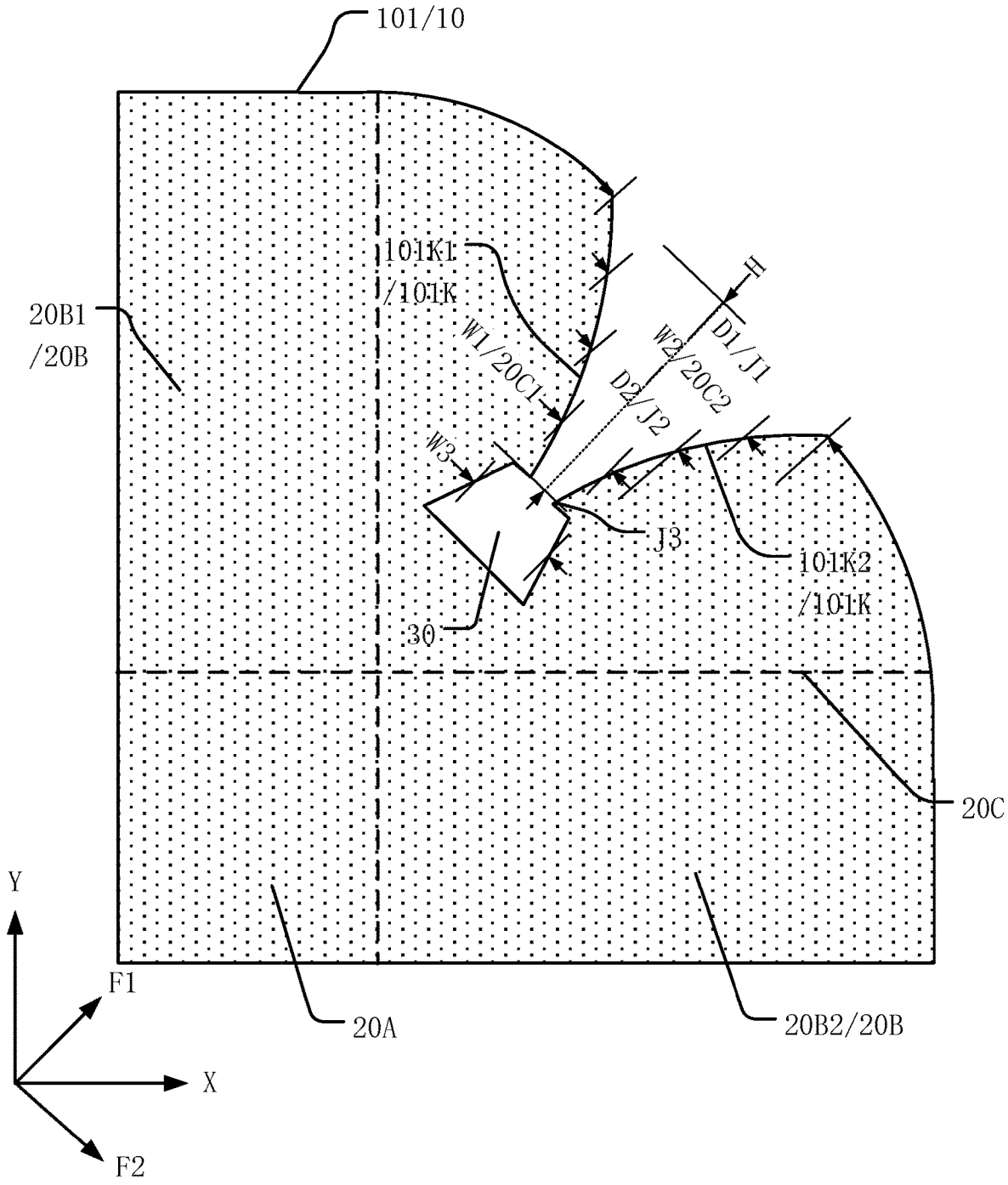
FIG. 7 illustrates a locally enlarged structure of an M2 region in FIG. 6, consistent with various disclosed embodiments of the present disclosure.

In some other embodiments shown in FIG. 1, FIG. 2, FIG. 6 which is another planar structure before the heat dissipation layer in the composite layer is bonded, and FIG. 7 which is a locally enlarged view of the M2 region in FIG. 6, in one corner region 20C of the plurality of corner regions 20C, the heat dissipation layer 101 may include a first edge 101K1 and a second edge 101K2 forming one opening 101K. At the intersection of the first edge 101K1 and the second edge 101K2, the heat dissipation layer 101 in the corner region 20C may include a crack relief opening 30.

Along the first direction F1, a width W3 of the crack relief opening 30 in the second direction F2 may gradually increase, and the width W3 of the crack relief opening 30 in the second direction F2 may be larger when closer to the planar region 20A.

In the present embodiment, when the heat dissipation layer 101 of the composite layer 10 is provided with one opening 101K in the corner region 20C, at the root of the opening 101K, that is, at the intersection of the first edge 101K1 and the second edge 101K2 forming the opening 101K, the heat dissipation layer 101 may be also provided with the crack relief opening 30. The root of the opening 101K (at the position J3 shown in FIG. 7) may be understood as an end of the opening 101K having the narrowest width in the second direction F2, and may also be understood as an end of the opening 101K closest to the planar region 20A. The opening 101K may be connected with the crack relief opening 30 at the root of the opening 101K. Since the width of the opening 101K in the second direction F2 may tend to become narrower at an accelerated rate in the first direction F1 and from the corner region 20C to the planar region 20A, the first edge 101K1 and the second edge 101K2 forming the opening 101K may be arc-shaped, and the arc-shaped first edge 101K1 and the arc-shaped second edge 101K2 may both extend from the edge position of the corner region 20C toward the direction close to the planar region 20A to form the structure of the opening 101K in this embodiment. The shape of the crack relief opening 30 in this embodiment may be that the width W3 of the crack relief opening 30 in the second direction F2 gradually becomes larger along the first direction F1 (that is, along the extension direction of the opening 101K), and the width W3 of the crack relief opening 30 in the second direction F2 may be larger when closer to the planar region 20A and may be smaller when closer to the opening 101K. Therefore, an end of the crack relief opening 30 away from the opening 101K may have a larger width W3 in the second direction F2, to prevent the width W3 of the end of the crack relief opening 30 away from the opening 101K from becoming smaller and forming a tendency to continue to tear toward the planar region 20A. Correspondingly, in the process of bonding the heat dissipation layer 101, even when the force is improper, the possibility of the root of the opening 101K continuing to spread toward the planar region 20A may be reduced, improving the bonding yield of the heat dissipation layer 101 and ensuring product quality.

Figure 8:
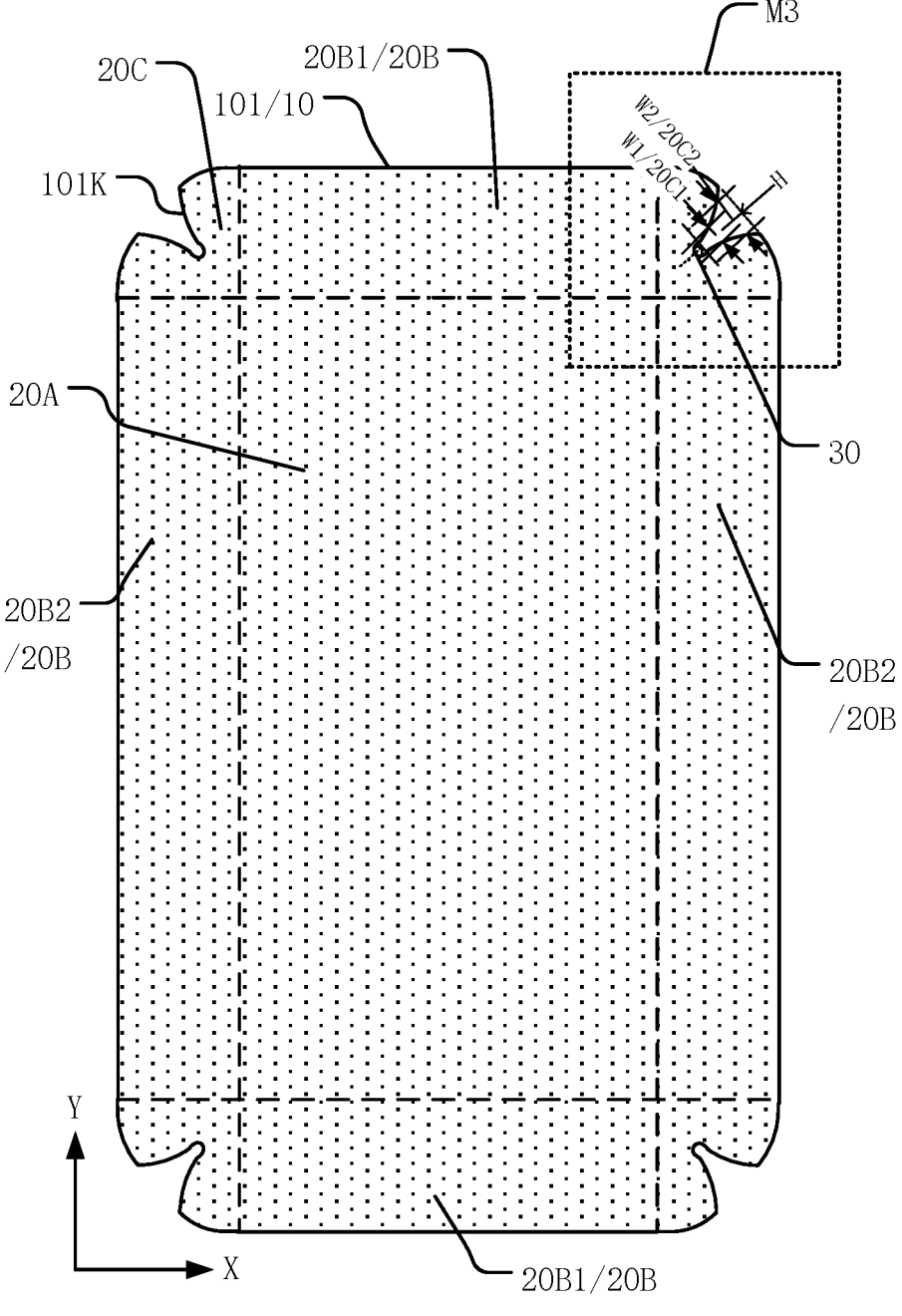
FIG. 8 illustrates another planar structure in FIG. 1 and FIG. 2 before a heat dissipation layer in a composite layer is bonded, consistent with various disclosed embodiments of the present disclosure.
Figure 9:
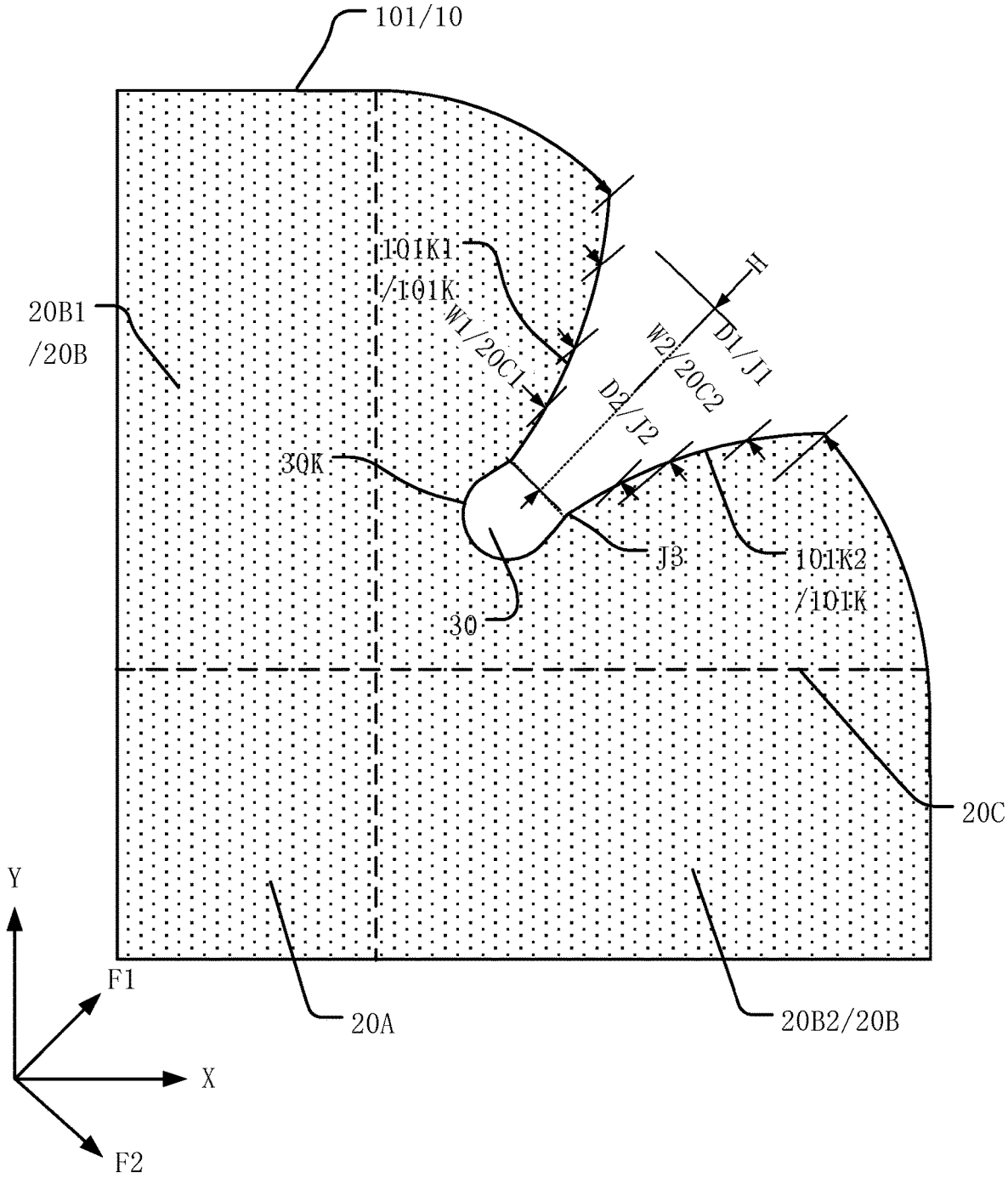
FIG. 9 illustrates a locally enlarged structure of an M3 region in FIG. 8, consistent with various disclosed embodiments of the present disclosure.

In some other embodiments shown in FIG. 1, FIG. 8 which is another planar structure before the heat dissipation layer in the composite layer is bonded, and FIG. 9 which is a locally enlarged view of the M3 region in FIG. 8, in one corner region 20C of the plurality of corner regions 20C, the heat dissipation layer 101 may include a first edge 101K1 and a second edge 101K2 forming one opening 101K. At the intersection of the first edge 101K1 and the second edge 101K2, the heat dissipation layer 101 in the corner region 20C may include a crack relief opening 30.

The crack relief opening 30 may include a crack relief edge 301. Along the first direction F1, the curvature of the crack relief edge 301 may gradually increase, and the curvature of the crack relief edge 301 may be larger when closer to the planar region 20A.

In the present embodiment, when the heat dissipation layer 101 of the composite layer 10 is provided with one opening 101K in the corner region 20C, at the root of the opening 101K, that is, at the intersection of the first edge 101K1 and the second edge 101K2 forming the opening 101K, the heat dissipation layer 101 may be also provided with the crack relief opening 30. The root of the opening 101K (at the position J3 shown in FIG. 7) may be understood as an end of the opening 101K having the narrowest width in the second direction F2, and may also be understood as an end of the opening 101K closest to the planar region 20A. The opening 101K may be connected with the crack relief opening 30 at the root of the opening 101K. Since the width of the opening 101K in the second direction F2 may tend to become narrower at an accelerated rate in the first direction F1 and from the corner region 20C to the planar region 20A, the first edge 101K1 and the second edge 101K2 forming the opening 101K may be arc-shaped, and the arc-shaped first edge 101K1 and the arc-shaped second edge 101K2 may both extend and recess from the edge position of the corner region 20C toward the direction close to the planar region 20A to form the structure of the opening 101K in this embodiment. The shape of the crack relief opening 30 in this embodiment may include the crack relief edge 301 and the crack relief edge 301 may be an arc. Along the first direction F1 (that is, the extending direction of the opening 101K), the curvature of the crack relief edge 301 may gradually increase, and the curvature of the crack relief edge 301 may be larger when closer to the planar region 20A. The arc-shaped crack relief edge 30K of the crack relief opening 30 may form a C-shaped structure that is concave toward the planar region 20A, to prevent the end of the crack relief opening 30 away from the opening 101K from forming a tendency to continue to tear toward the planar region 20A. Correspondingly, in the process of bonding the heat dissipation layer 101, even when the force is improper, the possibility of the root of the opening 101K continuing to spread toward the planar region 20A may be reduced, improving the bonding yield of the heat dissipation layer 101 and ensuring product quality.

Figure 10:
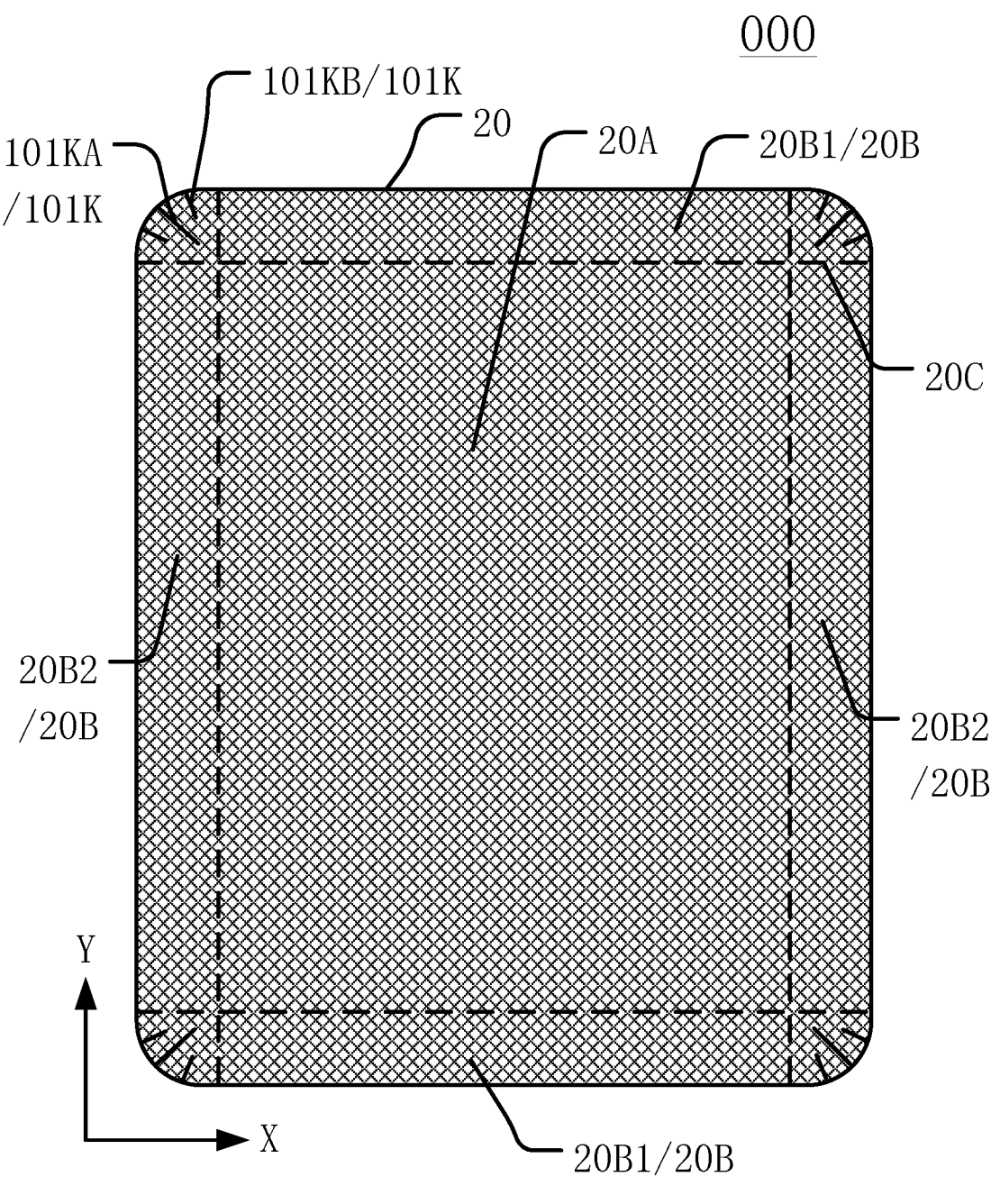
FIG. 10 illustrates another planar structure of a display module at a light-exiting side of a display panel consistent with various disclosed embodiments of the present disclosure.
Figure 11:
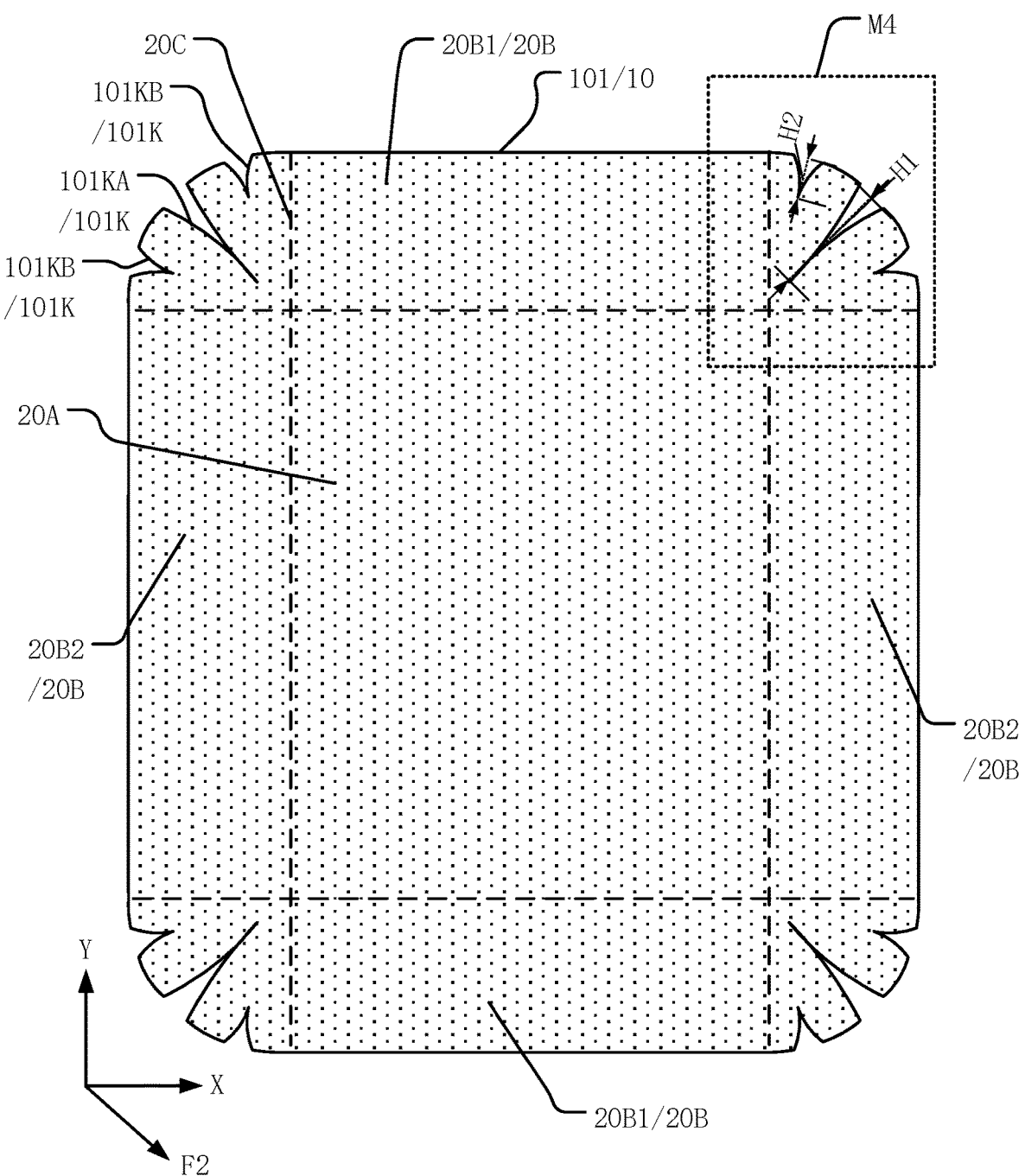
FIG. 11 illustrates a planar structure in FIG. 10 before a heat dissipation layer in a composite layer is bonded, consistent with various disclosed embodiments of the present disclosure.
Figure 12:
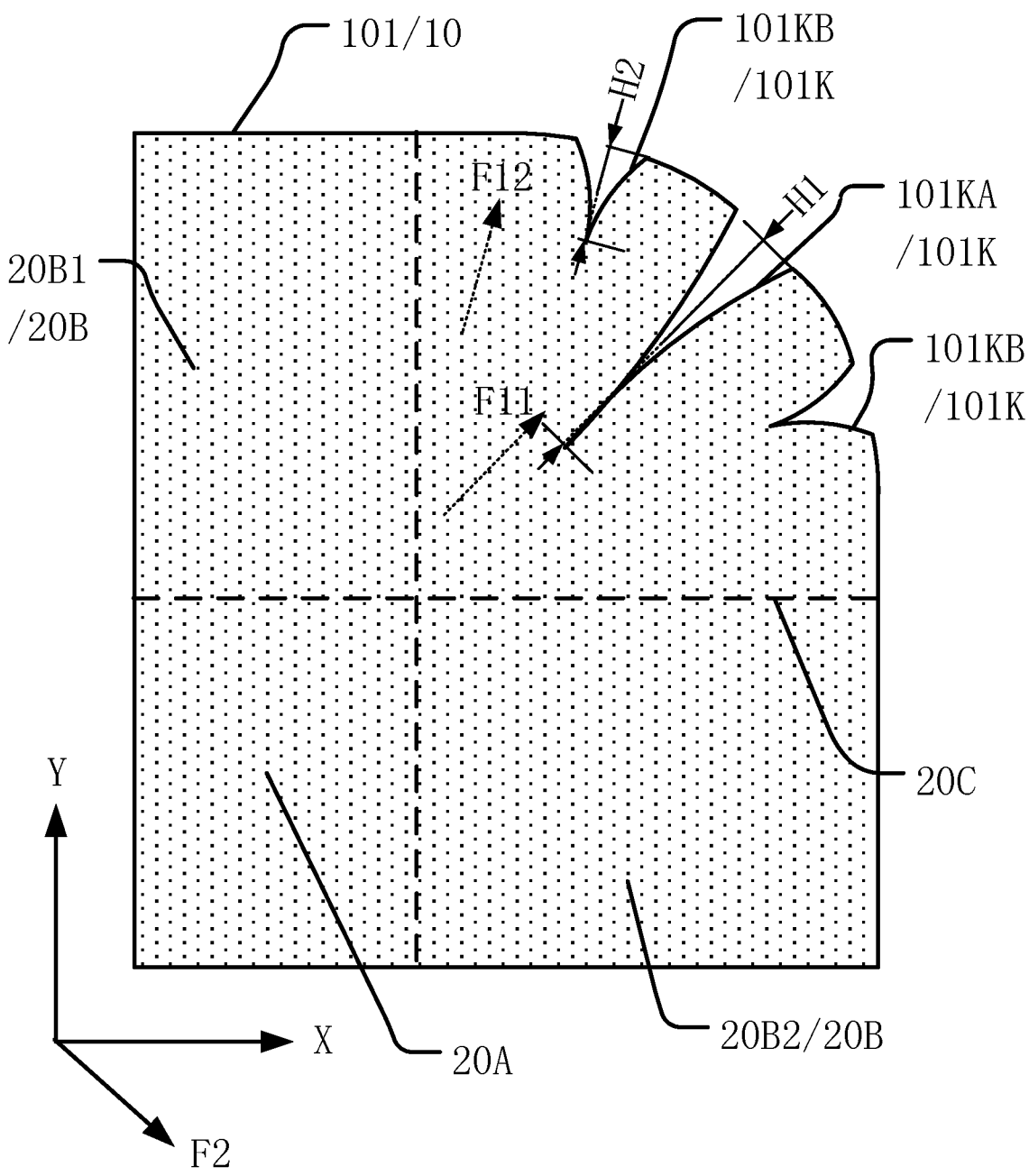
FIG. 12 illustrates a locally enlarged structure of an M4 region in FIG. 10, consistent with various disclosed embodiments of the present disclosure.
Figure 13:
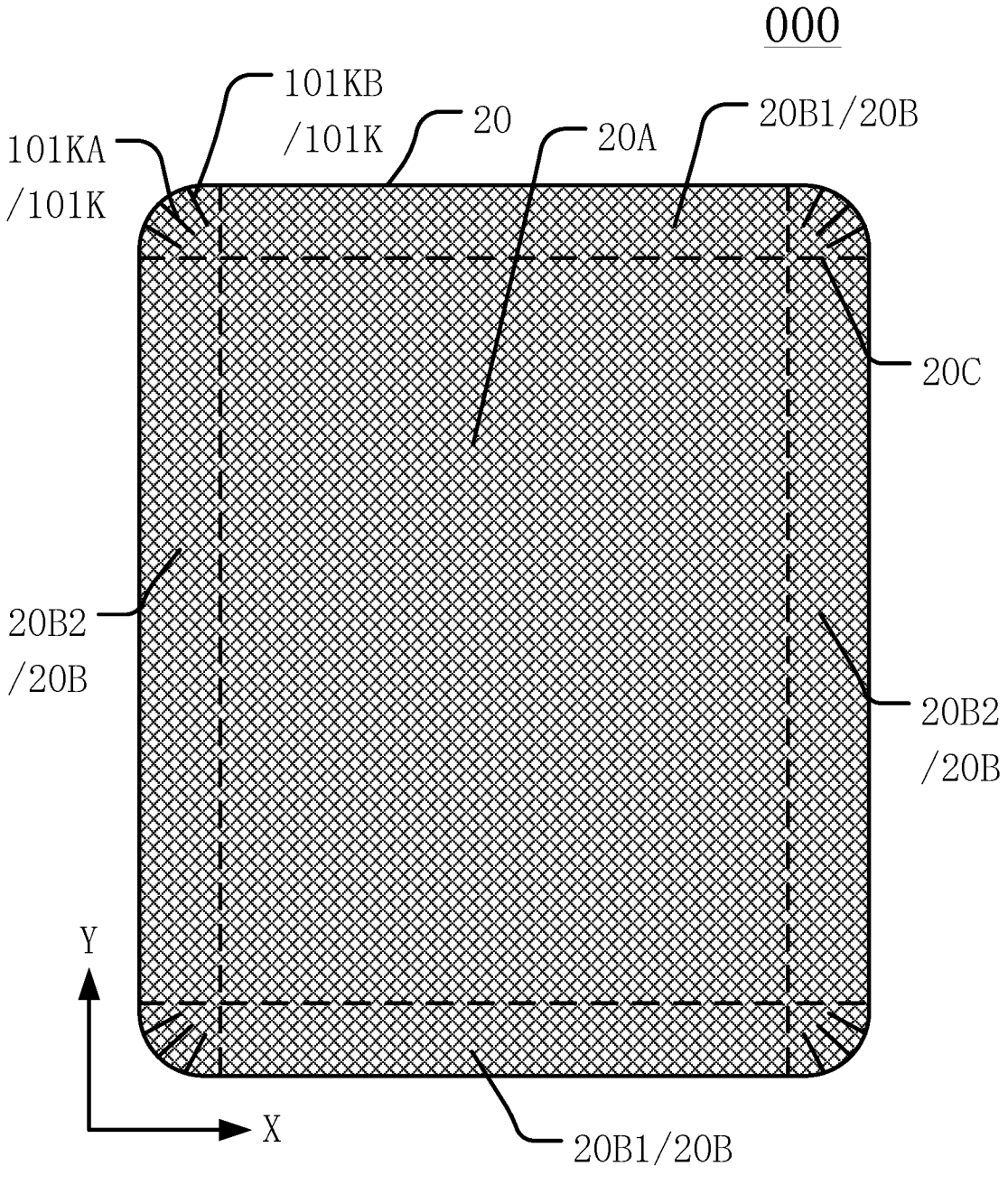
FIG. 13 illustrates another planar structure of a display module at a light-exiting side of a display panel consistent with various disclosed embodiments of the present disclosure.
Figure 14:
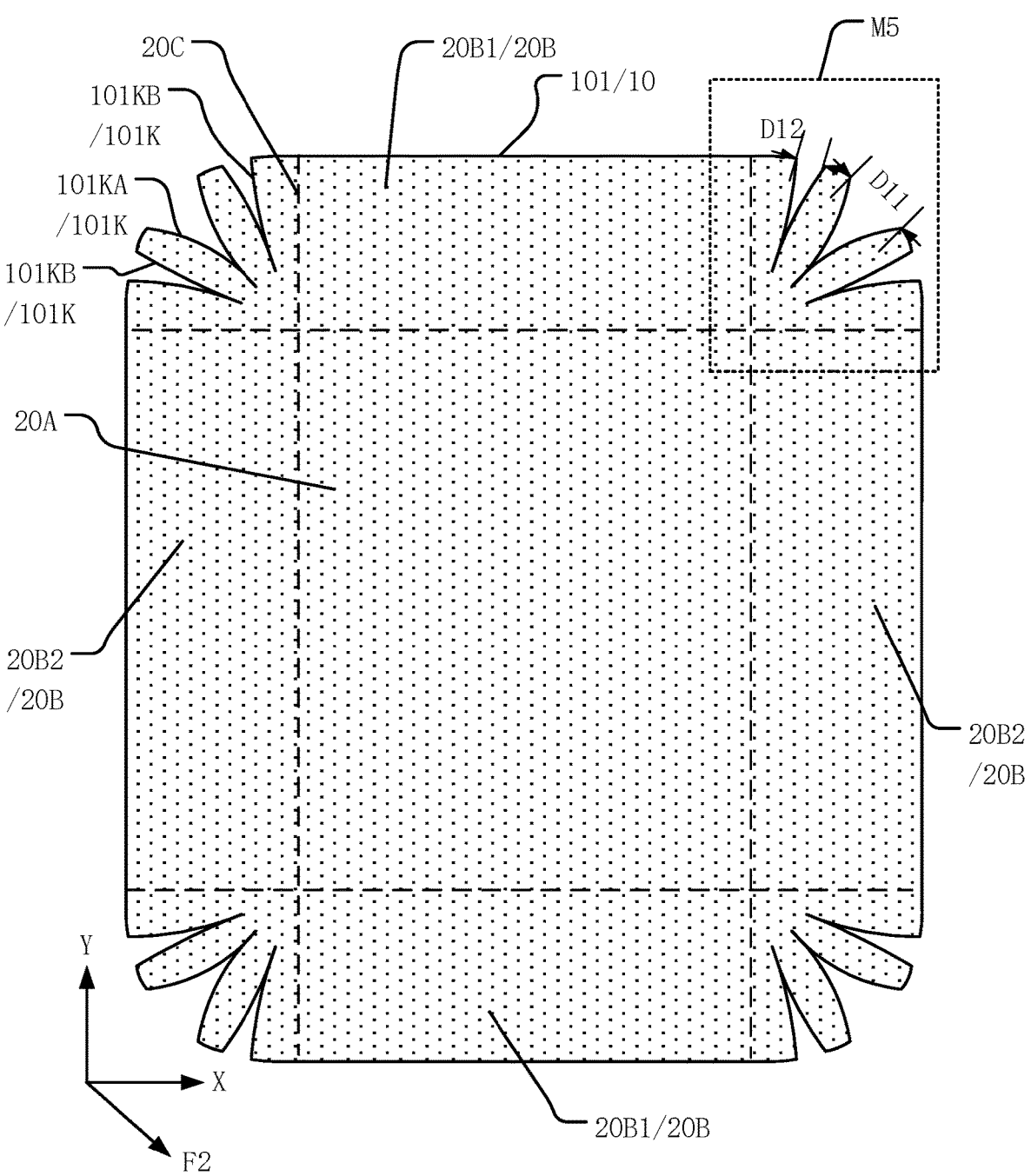
FIG. 14 illustrates a planar structure in FIG. 13 before a heat dissipation layer in a composite layer is bonded, consistent with various disclosed embodiments of the present disclosure.
Figure 15:
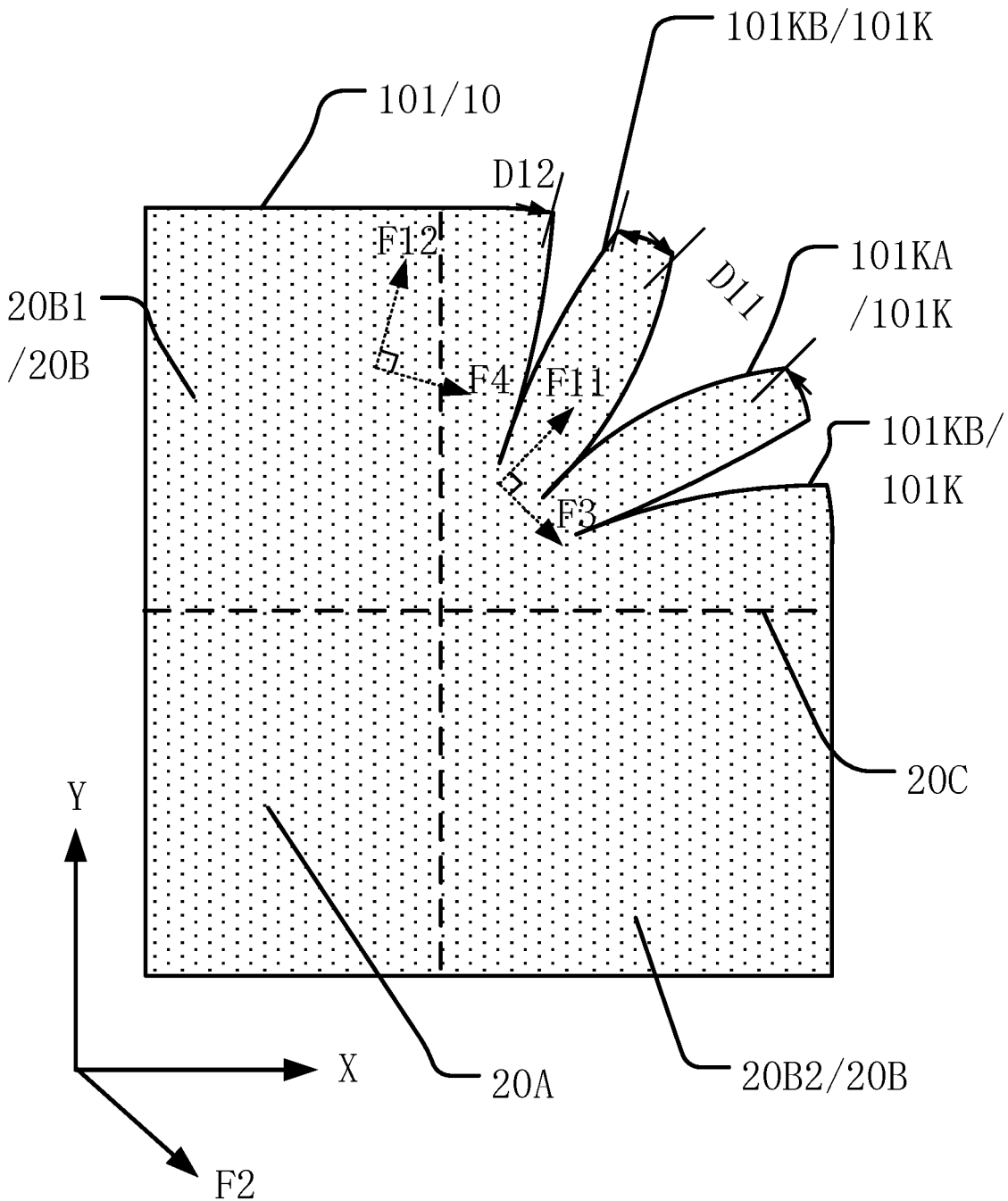
FIG. 15 illustrates a locally enlarged structure of an M5 region in FIG. 14, consistent with various disclosed embodiments of the present disclosure.
Figure 16:
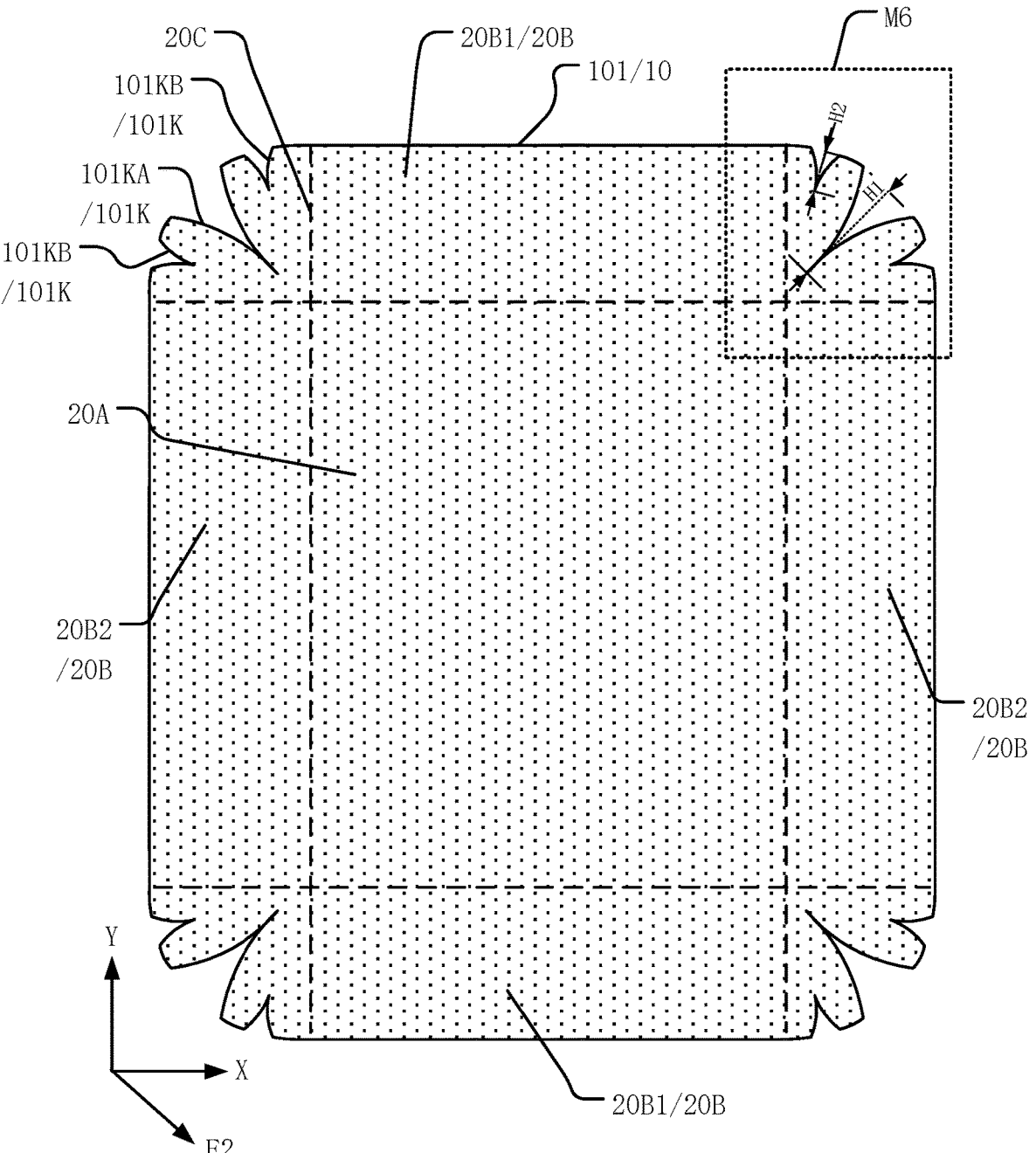
FIG. 16 illustrates a planar structure in FIG. 10 before a heat dissipation layer in a composite layer is bonded, consistent with various disclosed embodiments of the present disclosure.
Figure 17:
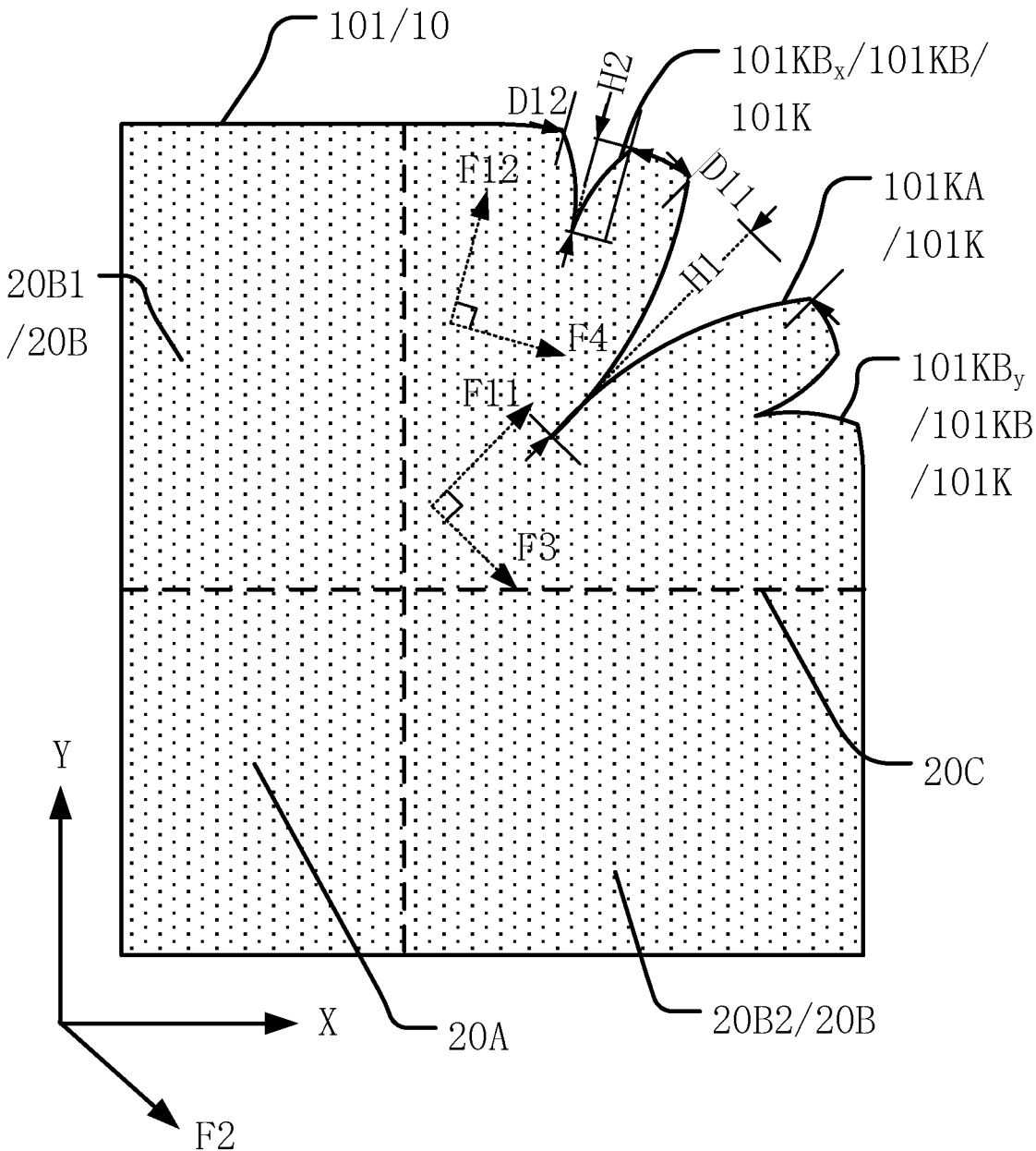
FIG. 17 illustrates a locally enlarged structure of an M6 region in FIG. 16, consistent with various disclosed embodiments of the present disclosure.

FIG. 10 illustrates another planar structure of a display module at a light-exiting side of a display panel; FIG. 11 illustrates a planar structure in FIG. 10 before a heat dissipation layer in a composite layer is bonded; FIG. 12 illustrates a locally enlarged structure of an M4 region in FIG. 10; FIG. 13 illustrates another planar structure of a display module at a light-exiting side of a display panel; FIG. 14 illustrates a planar structure in FIG. 13 before a heat dissipation layer in a composite layer is bonded; FIG. 15 illustrates a locally enlarged structure of an M5 region in FIG. 14; FIG. 16 illustrates a planar structure in FIG. 10 before a heat dissipation layer in a composite layer is bonded; and FIG. 17 illustrates a locally enlarged structure of an M6 region in FIG. 16. FIG. 10 and FIG. 13 are filled with transparency to clearly illustrate the opening structure of the heat dissipation layer on the backlight side of the display panel. FIG. 11, FIG. 14, and FIG. 16 illustrate the planar structure of the heat dissipation layer before the composite tap layer is bonded with the display panel. As shown in FIG. 10 to FIG. 17, in some embodiment, one corner region 20C of the plurality of corner regions 20C may include a plurality of openings 101K. The plurality of openings 101K may at least include a first-level opening 101KA and a second-level opening 101KB.

A length H1 of the first-level opening 101KA in an extending direction of the first-level opening 101KA (the direction F11 in the figure) may be different from a length H2 of the second-level opening 101KB in the extending direction of the second-level opening 101KB (the direction F12 in the figure); and/or, the maximum value D11 of the width of the first-level opening 101KA in the third direction F3 may be different from the maximum value D12 of the width of the second-level opening 101KB in the fourth direction F4. The third direction F3 may be perpendicular to the extending direction of the first-level opening 101KA (the direction F11 in the figure), and the fourth direction F4 may be perpendicular to the extending direction of the second-level opening 101KB (the direction F12 in the figure). In the present embodiment, the extending direction of the opening and the direction perpendicular to the extending direction of the opening may be different according to the different locations of the opening. For example, for one second-level opening 101KBx in FIG. 17, its extending direction may be understood as the direction F12 in FIG. 17, and the direction perpendicular to the direction F12 may be the fourth direction F4 in FIG. 17. For another second-level opening 101KBy located at the other side of the first-level opening 101KA, its extension direction and the direction perpendicular to its own extension direction may be two other directions. For the openings at different positions, these two directions may be different, which is not described in detail here.

In the present embodiment, the heat dissipation layer 101 of the composite tap layer 10 in one corner region 20C of the plurality of corner regions 20C may include a plurality of openings 101K. The plurality of openings 101K in one same corner region 20C may at least include a first-level opening 101KA and a second-level opening 101KB. The difference between the first-level opening 101KA and the second-level opening 101KB may include that: the length H1 of the first-level opening 101KA in the extending direction of the first-level opening 101KA (the direction F11 in the figure) may be different from the length H2 of the second-level opening 101KB in the extending direction of the second-level opening 101KB (the direction F12 in the figure) as shown in FIG. 12, or the maximum value D11 of the width of the first-level opening 101KA in the third direction F3 may be different from the maximum value D12 of the width of the second-level opening 101KB in the fourth direction F4 as shown in FIG. 15, or the length H1 of the first-level opening 101KA in the extending direction of the first-level opening 101KA (the direction F11 in the figure) may be different from the length H2 of the second-level opening 101KB in the extending direction of the second-level opening 101KB (the direction F12 in the figure) and the maximum value D11 of the width of the first-level opening 101KA in the third direction F3 may be different from the maximum value D12 of the width of the second-level opening 101KB in the fourth direction F4 as shown in FIG. 17. The present disclosure has no specific limit on this, as long as that at least one of the length H1 of the first-level opening 101KA in the extending direction of the first-level opening 101KA (the direction F11 in the figure) and the length H2 of the second-level opening 101KB in the extending direction of the second-level opening 101KB (the direction F12 in the figure) or the maximum value D11 of the width of the first-level opening 101KA in the third direction F3 and the maximum value D12 of the width of the second-level opening 101KB in the fourth direction F4 is different, such that the openings 101K with different shapes may be formed in the corner region 20C of the heat dissipation layer 101. In the present embodiment, multi-level openings with different length, or with different maximum width, or with different length and different maximum width may be formed in the corner region 20C of the heat dissipation layer 101. By forming the multi-level openings 101K with different shapes, when the heat dissipation layer 101 is attached to the corner region 20C, the deformation caused by compression may be released more, thereby further improving the attachment effect of the heat dissipation layer 101 on the corner region 20C and ensuring the bonding yield.

In one embodiment shown in FIG. 10 to FIG. 12, the heat dissipation layer 101 in the corner region 20C may include one first-level opening 101KA and at least two second-level openings 101KB. Along the second direction F2, the first-level opening 101KA may be disposed between the at least two second-level openings 101KB, such that the at least two second-level openings 101KB may be symmetrically arranged on two sides of the one first-level opening 101KA to ensure that the buckling stress of the heat dissipation layer 101 may be released more evenly when the heat dissipation layer 101 is attached. The attachment yield may be ensured, and the bonding difficulty may be reduced, improving process efficiency.

The embodiment where the heat dissipation layer 101 in the corner region 20C may include one first-level opening 101KA and two second-level openings 101KB is used as an example only to illustrate the present disclosure, and does not limit the scope of the present disclosure. In some other embodiment, the heat dissipation layer 101 in the corner region 20C may include one first-level opening 101KA, two second-level openings 101KB, and two third-level openings. At least one of the length and width of the third-level openings may be different from the second-level openings. At least one of the length and width of the third-level openings may be different from the first-level openings. The two third-level openings may be symmetrically arranged at two opposite sides of the two second-level openings 101KB, to further improve the bonding yield. The present disclosure has no limit on the number of the openings 101K included in the heat dissipation layer in one same corner region 20C which may be configured according to actual needs.

In one embodiment shown in FIG. 10 to FIG. 12, the heat dissipation layer 101 in one corner region 20C may include one first-level opening 101KA and two second-level openings 101KB. Along the second direction F2, the first-level opening 101KA may be disposed between the two second-level openings 101KB. The length H1 of the first-level opening 101KA in the extending direction of the first-level opening 101KA (the direction F11 in the figure) may be larger than the length H2 of the second-level openings 101KB in the extending direction of the second-level openings 101KB (the direction F12 in the figure). Further, optionally, the maximum value D11 of the width of the first-level opening 101KA in the direction perpendicular to its extending direction may be the same as the maximum value D12 of the width of the second-level openings 101KB in the direction perpendicular to the extending direction (that is, the width of the openings of two levels at the edge position of the corner region 20C may be same). By disposing openings 101K of multi levels with different length, when the heat dissipation layer 101 is attached to the corner region 20C, the deformation caused by compression may be released more, thereby further improving the attachment effect of the heat dissipation layer 101 on the corner region 20C and ensuring the bonding yield. Further, the roots of the second-level openings 101KB may be far away from the boundary of the first-level opening 101KA, to prevent the heat dissipation layer 101 from breaking at the corner region and being detached from the planar region 20A and the curved region 20B because of a small distance between the roots of the second-level openings 101KB and the root of the first-level opening 101KA. The product quality after bonding the heat dissipation layer 101 and the display panel 20 may be improved.

In another embodiment shown in FIG. 13 to FIG. 15, the heat dissipation layer 101 in one corner region 20C may include one first-level opening 101KA and two second-level openings 101KB. Along the second direction F2, the first-level opening 101KA may be disposed between the two second-level openings 101KB. The maximum value D11 of the width of the first-level opening 101KA in the third direction F3 may be larger than the maximum value D12 of the width of the second-level openings 101KB in the fourth direction F4. The third direction F3 may be perpendicular to the extending direction of the first-level opening 101KA (the direction F11 in the figure), and the fourth direction may be perpendicular to the extending direction of the second-level openings 101KB (the direction F12 in the figure). Further, optionally, the length H1 of the first-level opening 101KA in the extending direction of the first-level opening 101KA (the direction F11 in the figure) may be the same as the length H2 of the second-level openings 101KB in the extending direction of the second-level openings 101KB (the direction F12 in the figure). That is, the length of the openings of the two levels in the corner region 20C may be the same. By forming the multi-level openings 101K with different width, when the heat dissipation layer 101 is attached to the corner region 20C, the deformation caused by compression may be released more, thereby further improving the attachment effect of the heat dissipation layer 101 on the corner region 20C and ensuring the bonding yield.

In another embodiment, as shown in FIG. 10, FIG. 16, and FIG. 17, the heat dissipation layer 101 in one corner region 20C may include one first-level opening 101KA and two second-level openings 101KB. Along the second direction F2, the first-level opening 101KA may be disposed between the two second-level openings 101KB. The length H1 of the first-level opening 101KA in the extending direction of the first-level opening 101KA (the direction F11 in the figure) may be larger than the length H2 of the second-level openings 101KB in the extending direction of the second-level openings 101KB (the direction F12 in the figure), and the maximum value D11 of the width of the first-level opening 101KA in the third direction F3 may be larger than the maximum value D12 of the width of the second-level openings 101KB in the fourth direction F4. The third direction F3 may be perpendicular to the extending direction of the first-level opening 101KA (the direction F11 in the figure), and the fourth direction may be perpendicular to the extending direction of the second-level openings 101KB (the direction F12 in the figure). Therefore, among the multi-level openings 101K in the heat dissipation layer 101 in one same corner region 20C, when one opening 101K has a longer length along the extending direction, it may have larger maximum width in the direction perpendicular to the extending direction. Therefore, when the heat dissipation layer 101 is attached to the corner region 20C, the deformation caused by compression may be released more, thereby further improving the attachment effect of the heat dissipation layer 101 on the corner region 20C and ensuring the bonding yield. Further, the roots of the second-level openings 101KB may be far away from the boundary of the first-level opening 101KA, to prevent the heat dissipation layer 101 from breaking at the corner region and being detached from the planar region 20A and the curved region 20B because of a small distance between the roots of the second-level openings 101KB and the root of the first-level opening 101KA. The product quality after bonding the heat dissipation layer 101 and the display panel 20 may be improved.

Figure 18:
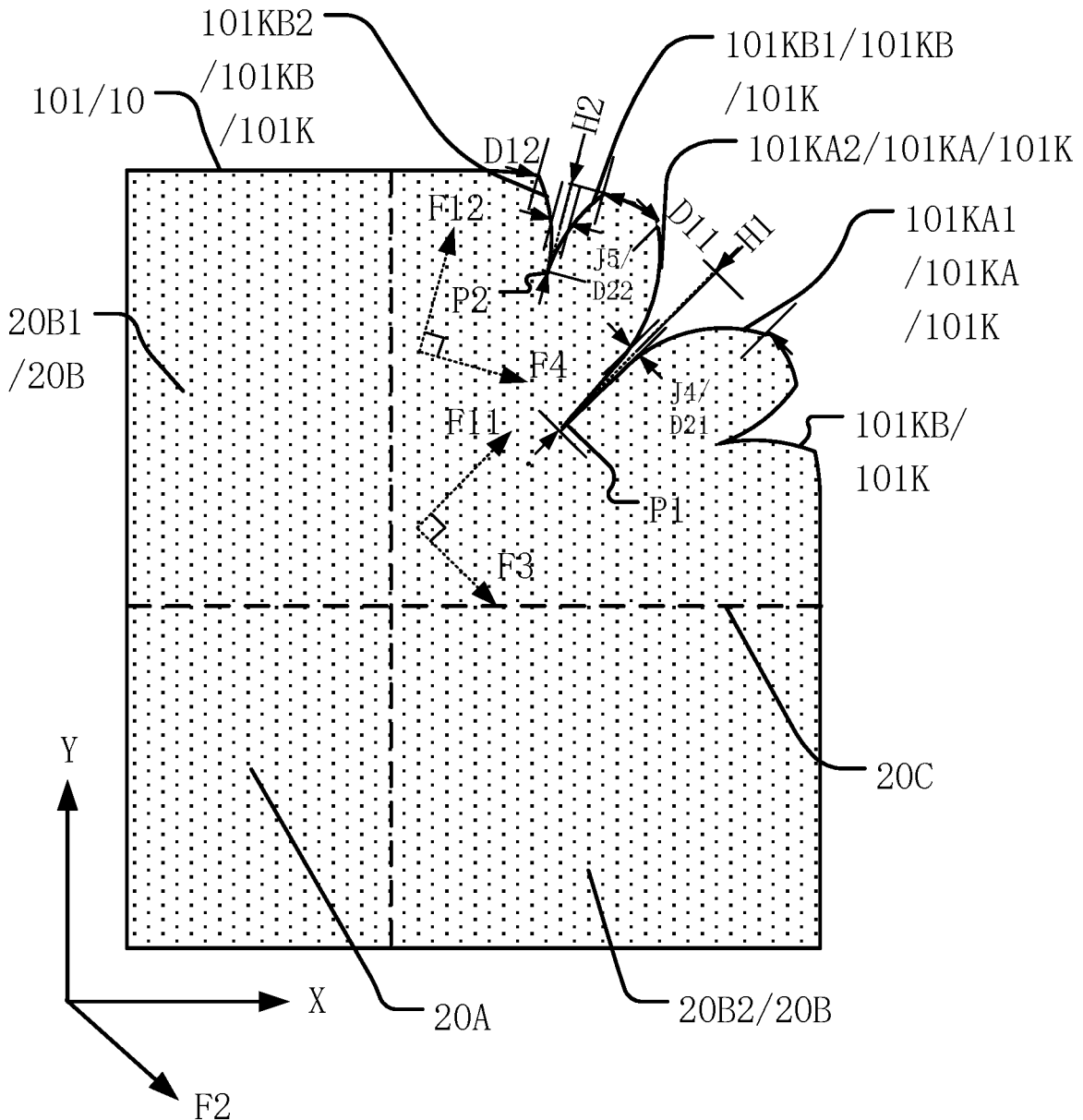
FIG. 18 illustrates another locally enlarged structure of an M6 region in FIG. 16, consistent with various disclosed embodiments of the present disclosure.

In some embodiments shown in FIG. 10, FIG. 16, and FIG. 18 which is an enlarged view of the M6 region in FIG. 16, at the position of 1/2H1, that is, at the half-length position of the first-level opening 101KA (the J4 position in FIG. 18), the width of the first-level opening 101KA in the third direction F3 may be D21. At the position of 1/2H2, that is, at the half-length position of one second-level opening 101KB (the J5 position in FIG. 18), the width of the second-level opening 101KB in the fourth direction F4 may be D22; where D21<D22.

In the present embodiment, the heat dissipation layer 101 of the composite tap layer 10 in one corner region 20C of the plurality of corner regions 20C may include a plurality of openings 101K. The plurality of openings 101K in one same corner region 20C may at least include a first-level opening 101KA and a second-level opening 101KB. The difference between the first-level opening 101KA and the second-level opening 101KB may include that: the length H1 of the first-level opening 101KA in the extending direction of the first-level opening 101KA (the direction F11 in the figure) may be larger than the length H2 of the second-level opening 101KB in the extending direction of the second-level opening 101KB (the direction F12 in the figure), the maximum value D11 of the width of the first-level opening 101KA in the third direction F3 may be larger than the maximum value D12 of the width of the second-level opening 101KB in the fourth direction F4, and the first-level opening 101KA may tend to narrow more rapidly toward the planar region 20A than the second-level opening 101KB. Specifically, the width D21 of the first-level opening 101KA in the third direction F3 at the position of 1/2H1 (that is, at the half-length position of the first-level opening 101KA, the J4 position in FIG. 18) may be smaller than half the maximum value D11 of the width of the first-level opening 101KA in the third direction F3, such that the width of the first-level opening 101KA in the third direction F3 tends to be narrowed at an accelerated rate along the direction from the corner region 20C to the planar region 20A. Also, the width D22 of the second-level opening 101KB in the fourth direction F4 at the position of 1/2H2 (that is, at the half-length position of the second-level opening 101KB, the J5 position in FIG. 18) may be smaller than half the maximum value D12 of the width of the second-level opening 101KB in the fourth direction F4, such that the width of the second-level opening 101KB in the fourth direction F4 tends to be narrowed at an accelerated rate along the direction from the corner region 20C to the planar region 20A. The edges of the first-level opening 101KA and the second-level opening 101KB formed in the heat dissipation layer 101 in the corner region 20C may be arc-shaped, and the shapes of the orthographic projections of the first-level opening 101KA and the second-level opening 101KB on the light-emitting surface of the display module 000 may be trumpet-shaped structures with roots at different positions. The width D21 of the first-level opening 101KA in the third direction F3 at the half-length position of the first-level opening 101KA (the J4 position in FIG. 18) may be smaller than the width D22 of the second-level opening 101KB in the fourth direction F4 at the half-length position of the second-level opening 101KB (the position J5 in FIG. 18), such that the width at the half-length position of the first-level opening 101KA may be narrower as the length is longer. The first-level opening 101KA may tend to become narrower faster than the second-level opening 101KB. Therefore, the edges forming the first-level opening 101KA may not diverge too far before bonding. When bonding the heat dissipation layer 101 and the display panel 20, the deformation caused by compression may be released better, so that the first-level opening 101KA may be more tightly closed after bonding, further improving the uniformity of heat dissipation at the position of the first-level opening 101KA.

In some embodiments, the heat dissipation layer 101 of the composite tap layer 10 in one corner region 20C of the plurality of corner regions 20C may include a plurality of openings 101K. The plurality of openings 101K in one same corner region 20C may at least include a first-level opening 101KA and a second-level opening 101KB. The roots of the first-level opening 101KA and the second-level opening 101KB may be provided with crack relief openings 30 shown in FIG. 6 to FIG. 9, which are not shown in FIG. 10 to FIG. 18, to prevent the roots of the openings form the tendency of cracking further toward the planar region 20A. The bonding yield may be improved.

In some embodiments, as shown in FIG. 10, FIG. 16, and FIG. 18, in one corner region 20C, the heat dissipation layer 101 may include a third edge 101KA1 and a fourth edge 101KA2 for forming the first-level opening 101KA. Along the extending direction of the first-level opening 101KA (the direction F11 in FIG. 18), the third edge 101KA1 and fourth edge 101KA2 may intersect with each other at a first vertex P1.

Further, in the corner region 20C, the heat dissipation layer 101 may include a fifth edge 101KB1 and a sixth edge 101KB2 for forming one second-level opening 101KB. Along the extending direction of the second-level opening 101KB (the direction F12 in FIG. 18), the fifth edge 101KB1 and the sixth edge 101KB2 may intersect with each other at a second vertex P2.

The first vertex P1 and the second vertex P2 may be located at different positions of the corner region 20C.

In the present embodiment, the plurality of openings 101K in one same corner region 20C may include one first-level opening 101KA and two second-level openings 101KB. Along the second direction F2, the first-level opening 101KA may be disposed between the two second-level openings 101KB. At least one of the length and maximum width of the first-level opening 101KA and the two second-level openings 101KB may be different. The third edge 101KA1 and fourth edge 101KA2 for forming the first-level opening 101KA may intersect with each other at the first vertex P1, and the third edge 101KA1 and fourth edge 101KA2 for forming the first-level opening 101KA may be arcs. The fifth edge 101KB1 and the sixth edge 101KB2 for forming one second-level opening 101KB may intersect with each other at the second vertex P2, and the fifth edge 101KB1 and the sixth edge 101KB2 for forming one second-level opening 101KB may be arcs. Therefore, although the first-level opening 101KA and the second-level openings 101KB may have different structures, they may both be structures with the trumpet-shaped opening. Further, although the first vertex P1 where the third edge 101KA1 and the fourth edge 101KA2 intersect to form the first-level opening 101KA, and the second vertex P2 where the fifth edge 101KB1 and the sixth edge 101KB2 intersect to form the second-level opening 101KB are located in the corner region 20C, they may be located in different positions of the corner region 20C. By disposing openings 101K of multi-levels with different length, when the heat dissipation layer 101 is attached to the corner region 20C, the deformation caused by compression may be released more, thereby further improving the attachment effect of the heat dissipation layer 101 on the corner region 20C and ensuring the bonding yield. Further, the second vertex P2 of the second-level opening 101KB may be far away from the third edge 101KA1 and the fourth edge 101KA2 of the first-level opening 101KA, and the second vertex P2 of the second-level opening 101KB may be also far away from the first vertex P1 of the first-level opening 101KA. The heat dissipation layer 101 may be prevented from breaking at the corner region 20C and being detached from the planar region 20A and the curved region 20B because of a small distance between the second vertex P2 of the second-level opening 101KB (the root of the second-level opening 101KB) and the first vertex P1 of the first-level opening 101KA (the root of the first-level opening 101KA). The product quality after bonding the heat dissipation layer 101 and the display panel 20 may be improved. Further, the first vertex P1 where the third edge 101KA1 and the fourth edge 101KA2 intersect to form the first-level opening 101KA, and the second vertex P2 where the fifth edge 101KB1 and the sixth edge 101KB2 intersect to form the second-level opening 101KB may both be located in the corner region 20C. Correspondingly, it may be easy to form the openings of the heat dissipation layer 101 in the corner region 20C and the heat dissipation layer 101 in the planar region 20A may support the display panel 20.

Figure 19:
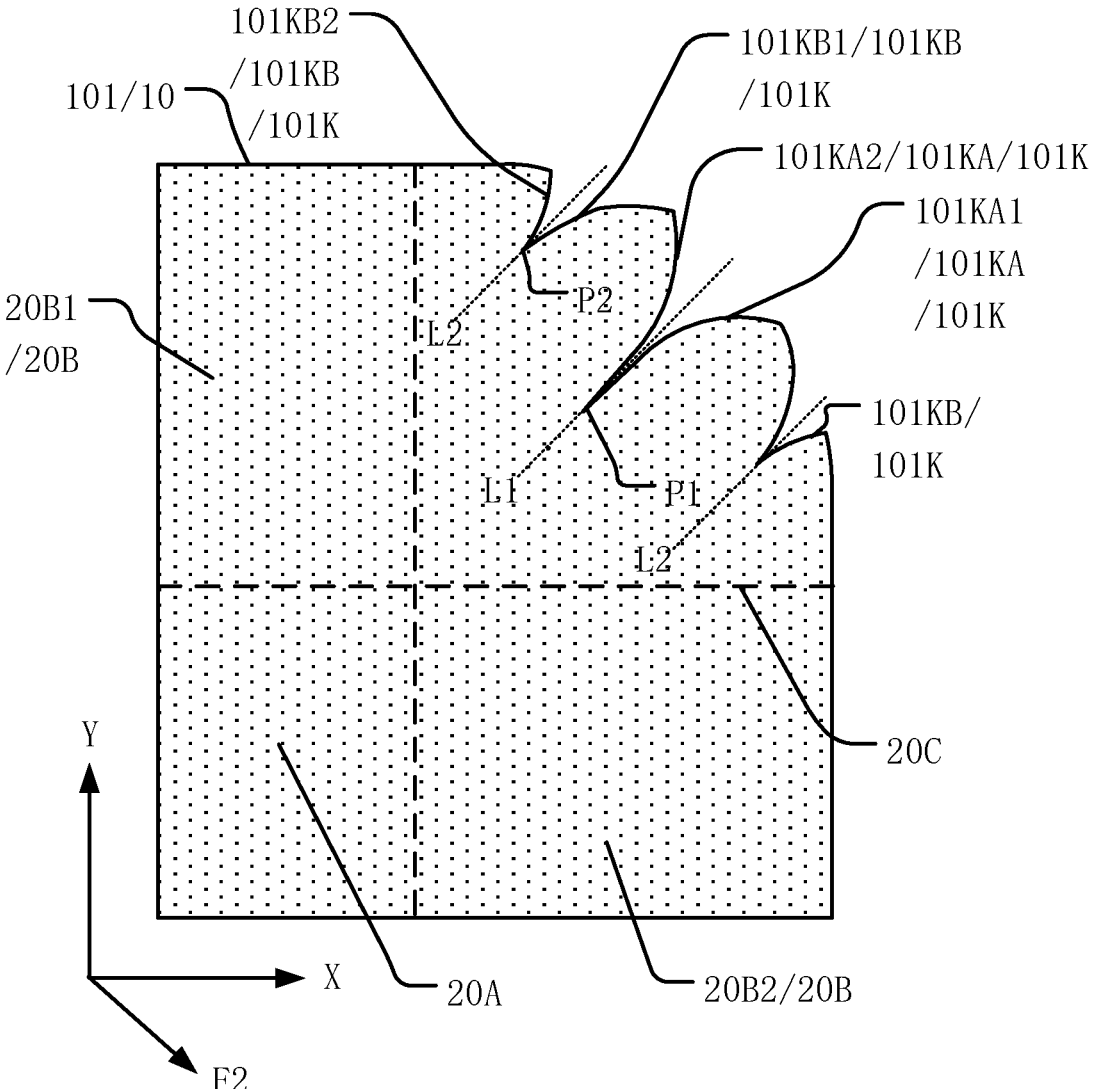
FIG. 19 illustrates another locally enlarged structure of an M6 region in FIG. 16, consistent with various disclosed embodiments of the present disclosure.

In some embodiments shown in FIG. 10, FIG. 16, and FIG. 19 which is an enlarged view of the M6 region in FIG. 16, the third edge 101KA1 and the fourth edge 101KA2 may be mutually symmetrical structures along a first symmetric axis L1, and the fifth edge 101KB1 and the sixth edge 101KB2 may be mutually symmetrical structures along a second symmetric axis L2.

The first symmetric axis L1 and the second first symmetric axis L2 may not intersect.

In the present embodiment, the plurality of openings 101K in the same corner region 20C may include one first-level opening 101KA and two second-level openings 101KB. The third edge 101KA1 and fourth edge 101KA2 for forming the first-level opening 101KA with trumpet shape may intersect with each other at the first vertex P1. The fifth edge 101KB1 and the sixth edge 101KB2 for forming one second-level opening 101KB with a trumpet shape may intersect with each other at the second vertex P2. The third edge 101KA1 and the fourth edge 101KA2 may be mutually symmetrical structures along a first symmetric axis L1, and the fifth edge 101KB1 and the sixth edge 101KB2 may be mutually symmetrical structures along a second symmetric axis L2. The first symmetric axis L1 and the second first symmetric axis L2 may not intersect. That is, the first symmetric axis L1 between the third edge 101KA1 and the fourth edge 101KA2 of the first-level opening 101KA, and the second symmetric axis L2 between the fifth edge 101KB1 and the sixth edge 101KB2 of the second-level opening 101KB may be mutually parallel structures. Therefore, when improper force is used during the bonding process, the heat dissipation layer 101 may be prevented from being broken at the corner region 20C when the first-level opening 101KA and the second-level opening 101KB are torn along their respective roots. After the heat dissipation layer 101 is bonded to the display panel 20, the integrity of the heat dissipation layer 101 in the planar region 20A, the heat dissipation layer 101 in the curved regions 20B, and the heat dissipation layer 101 in the corner regions 20C may be ensured, to ensure the overall heat dissipation uniformity of the display panel 20 and further improve product quality.

Figure 20:
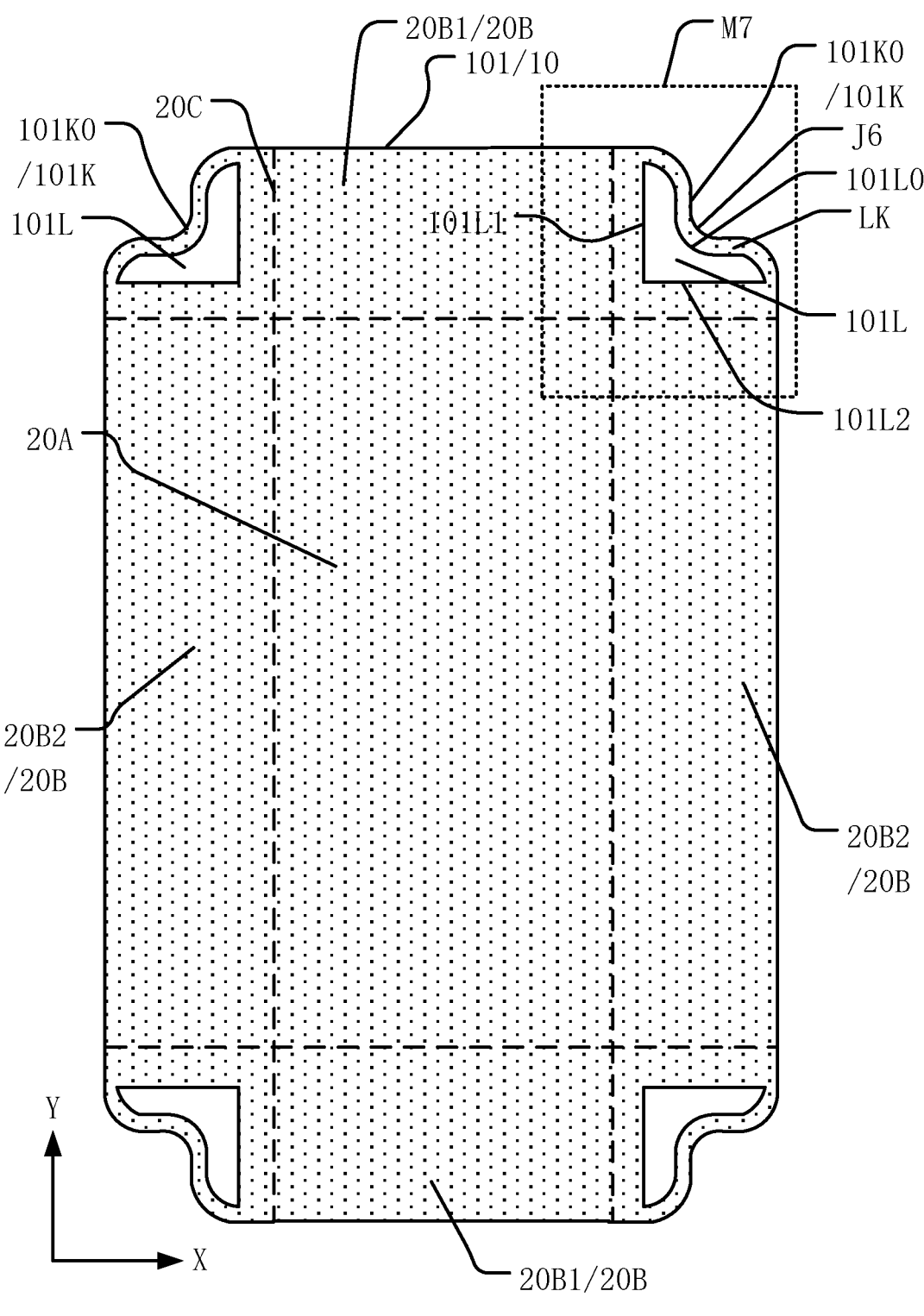
FIG. 20 illustrates another planar structure in FIG. 1 and FIG. 2 before a heat dissipation layer in a composite layer is bonded, consistent with various disclosed embodiments of the present disclosure.

In some embodiments, as shown in FIG. 1, FIG. 2, and FIG. 20 which is a planar structure before the heat dissipation layer in the composite layer is bonded in FIG. 1 and FIG. 2 (For illustration purpose, FIG. 20 shows the planar structure of the heat dissipation layer before the composite layer is bonded to the display panel), in one corner region 20C, the heat dissipation layer 101 may further include a hollow part 101L. Along the first direction F1, the hollow part 101L may be located at a side of the opening 101K close to the planar region 20A.

Figure 21:
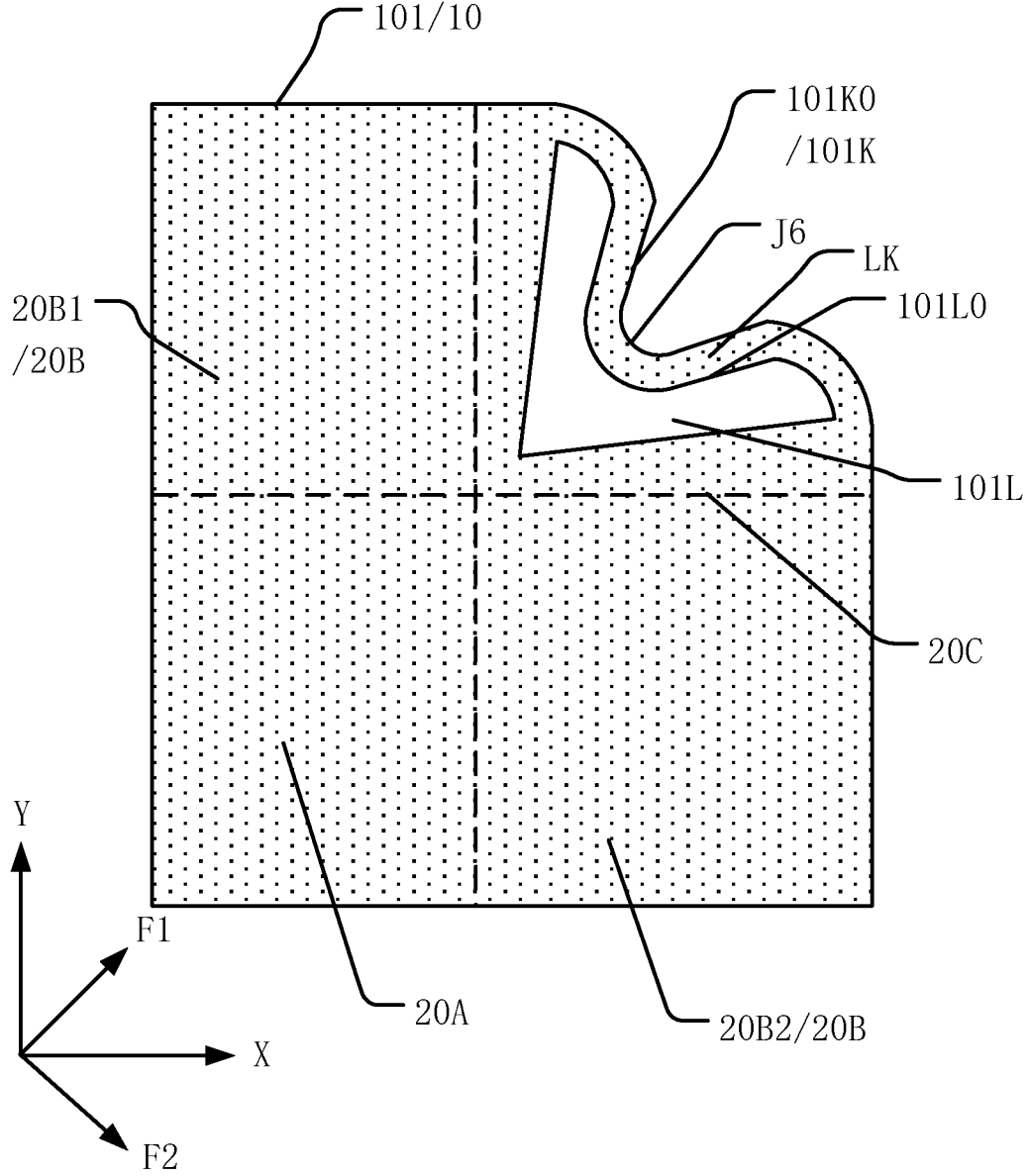
FIG. 21 illustrates a local view of an M7 region when a heat dissipation layer is bonded with a display panel in FIG. 20, consistent with various disclosed embodiments of the present disclosure.

In the present embodiment, the heat dissipation layer 101 in the composite layer 10 may not only include the opening 101K in the corner region 20C, but also include the hollow part 101L at the side of the opening 101K close to the planar region 20A. The roots of the hollow part 101L and the opening 101K may not be connected. The root of the opening 101K may be understood as the end of the opening 101K having the narrowest width in the second direction F2 (the position J6 as shown in FIG. 20). The hollow part 101L opened in the heat dissipation layer 101 at the corner region 20C may be formed to penetrate through the entire thickness of the heat dissipation layer 101, and the hollow part 101L may be used as a space concaved at the edge of the opening 101K as shown in FIG. 21 is a partial schematic diagram of the M7 region in FIG. 20 during the bonding process of the heat dissipation layer and the display panel. When the heat dissipation layer 101 in the corner region 20C is bonded to the backlight surface of the display panel 20, the arc edges of the trumpet-shaped opening 101K may follow the curved surface shape of the corner region 20C to adapt to the space after releasing deformation when compressed. Therefore, the arc edges of the opening 101K may be merged together as much as possible, avoiding the gap between the arc edges of the opening 101K after bonding, to ensure the uniformity of heat dissipation of the heat dissipation layer 101 at the corner. Further, when the hollow part 101L is provided at the side of the opening 101K close to the planar region 20A, the arc edges of the opening 101K may be curved towards the hollow part 101L inwardly, to ensure that the curved edges of the opening 101K may be accommodated in the region where the hollow part is located when it is concave. After the heat dissipation layer 101 is bonded to the display panel 20, the curved edges of the opening 101K may be prevented from forming wrinkles on the curved surface of the corner region 20C, to improve the bond yield of the heat dissipation layer 101 in the corner region 20C.

In one embodiment shown in FIG. 1, FIG. 2, FIG. 20 and FIG. 21, in the corner region 20C, the heat dissipation layer 101 may include a first sub-edge 101K0 forming the opening 101K, and the hollow part 101L may include a second sub-edge 101L0 facing the opening 101K. The shape of the second sub-edge 101L0 may be the same as that of the first sub-edge 101K0.

In the present embodiment, the heat dissipation layer 101 in the composite layer 10 may not only include the opening 101K in the corner region 20C, but also include the hollow part 101L at the side of the opening 101K close to the planar region 20A. The roots of the hollow part 101L and the opening 101K may not be connected. The first sub-edge 101K0 of the opening 101K and the second sub-edge 101L0 of the hollow part 101L may be configured to have the same shape. The first sub-edge 101K0 of the opening 101K may be understood as the edge forming the opening 101K (the first sub-edge 101K0 is equivalent to the formed edge after the first edge 101KA1 and the second edge 101KA2 meet together in previous embodiments), and the second sub-edge 101L0 may be understood as an edge of the hollow part 101L facing the opening 101K in the length extending direction of the opening 101K (as along the first direction F1 in the figure). By configuring the first sub-edge 101K0 of the opening 101K and the second sub-edge 101L0 of the hollow part 101L to have the same shape, the connection structure between the opening 101K and the hollow part 101L (the connection structure LK between the first sub-edge 101K0 and the second sub-edge 101L0) may form an arc structure same as the first sub-edge 101K0 and the second sub-edge 101L0. Since the first sub-edge 101K0 of the opening 101K is a concave structure at its root, the connection structure LK between the opening 101K and the hollow part 101L may also be an arc-shaped structure concave toward the planar region 20A. Therefore, when bonding, the first sub-edge 101K0 of the opening 101K when it is concave may be more naturally accommodated in the region where the hollow part 101L is located. The bonding may be more convenient and the wrinkles may be avoided on the curved surface of the corner region 20C, improving the bonding yield.

Figure 22:
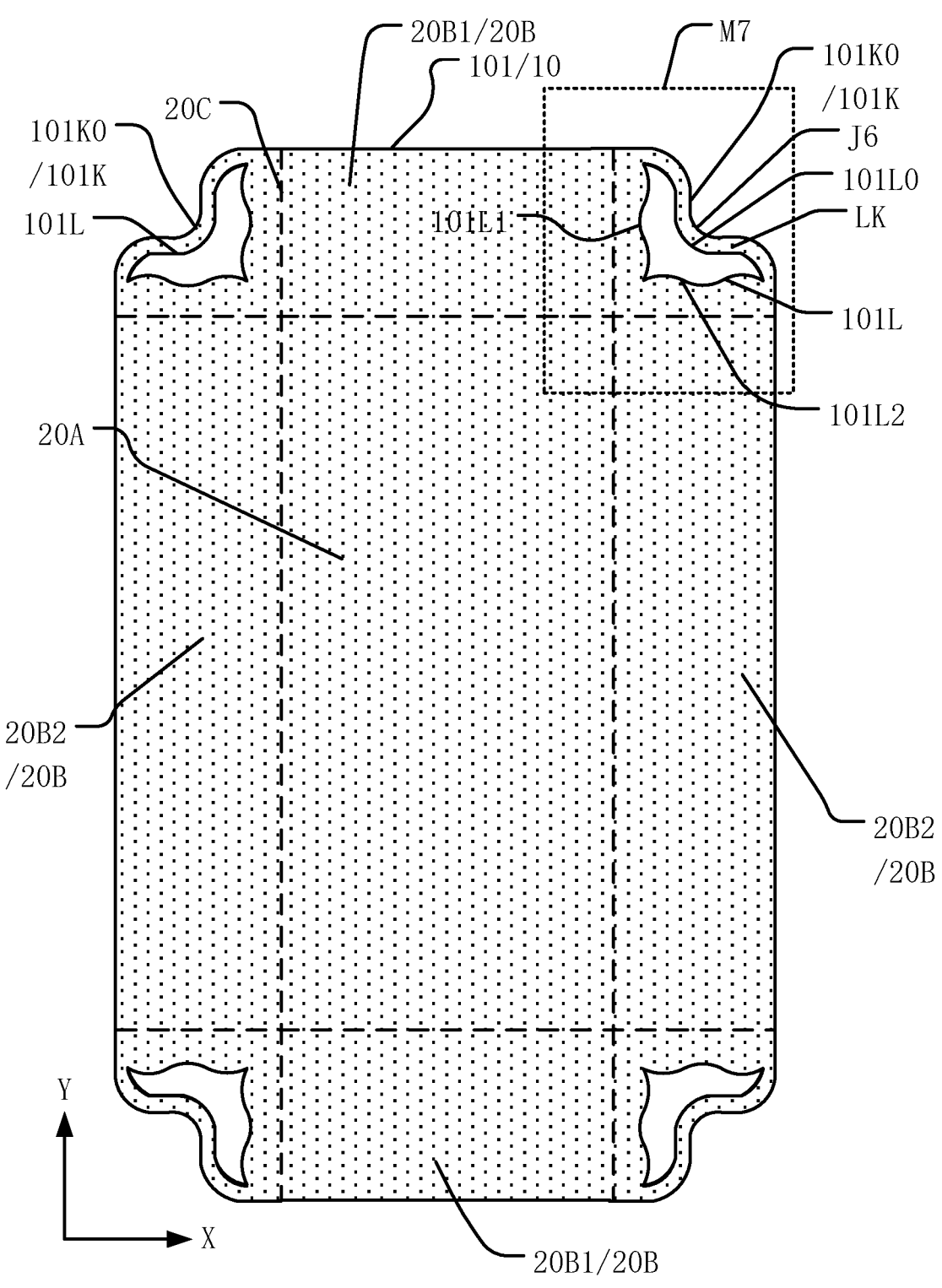
FIG. 22 illustrates another planar structure in FIG. 1 and FIG. 2 before a heat dissipation layer in a composite layer is bonded, consistent with various disclosed embodiments of the present disclosure.

In one embodiment, as shown in FIG. 1, FIG. 2, FIG. 20, FIG. 21, and FIG. 22 which is another planar structure before the heat dissipation layer in the composite layer is bonded in FIG. 1 and FIG. 2 (For illustration purpose, FIG. 22 shows the planar structure of the heat dissipation layer before the composite layer is bonded to the display panel), the hollow part 101L in the corner region 20C may include a third sub-edge 101L1 and a fourth sub-edge 101L2 respectively connected to two ends of the second sub-edge 101L0. The third sub-edge 101L1 and the fourth sub-edge 101L2 include any one of a straight line or a curved line.

In the present embodiment, the heat dissipation layer 101 in the composite layer 10 may not only include the opening 101K in the corner region 20C, but also include the hollow part 101L at the side of the opening 101K close to the planar region 20A. The roots of the hollow part 101L and the opening 101K may not be connected. The first sub-edge 101K0 of the opening 101K and the second sub-edge 101L0 of the hollow part 101L may have the same shape, and the other edges forming the hollow part 101L may be any of straight lines and curves. Specifically, the hollow part 101L in the corner region 20C may include the third sub-edge 101L1 and the fourth sub-edge 101L2 respectively connected to two ends of the second sub-edge 101L0. One end of the third sub-edge 101L1 may be connected to one end of the second sub-edge 101L0, and one end of the fourth sub-edge 101L2 may be connected to another end of the second sub-edge 101L0. Another end of the third sub-edge 101L1 may be connected to another end of the fourth sub-edge 101L2, to form the hollow part 101L. In this embodiment, the edge of the hollow part 101L except for the second sub-edge 101L0 may not necessarily be the same shape as the first sub-edge 101K0, but may be any other straight or curved shape, as long as the shape of the first sub-edge 101K0 of the opening 101K is the same as the shape of the second sub-edge 101L0 of the hollow part 101L such that the connection structure LK between the opening 101K and the hollow part 101L is an arc-shaped structure concave in the direction of the planar region 20A. Therefore, when bonding, the first sub-edge 101K0 of the opening 101K when it is concave may be more naturally accommodated in the region where the hollow part 101L is located. The bonding may be more convenient and the wrinkles may be avoided on the curved surface of the corner region 20C, improving the bonding yield.

Optionally, as shown in FIG. 21, when the third sub-edge 101L1 and the fourth sub-edge 101L2 are straight lines, the angle formed by the third sub-edge 101L1 and the fourth sub-edge 101L2 may be a right angle, such that the hollowed-out region of the hollow part 101L is large enough. When the first sub-edge 101K0 of the opening 101K is recessed during bonding, there may be enough accommodation space, which may further reduce the probability of wrinkles.

Optionally, as shown in FIG. 22, when the third sub-edge 101L1 and the fourth sub-edge 101L2 are curved lines, they may form the hollow part 101L together with the arc shape of the second sub-edge 101L0, and each of the edges of the hollow part 101L is arc-shaped or curved, which may facilitate the tendency of the first sub-edge 101K0 of the opening 101K to be accommodated in the region where the hollow part 101L is located when it is concave during bonding and make the bonding easy.

Figure 23:
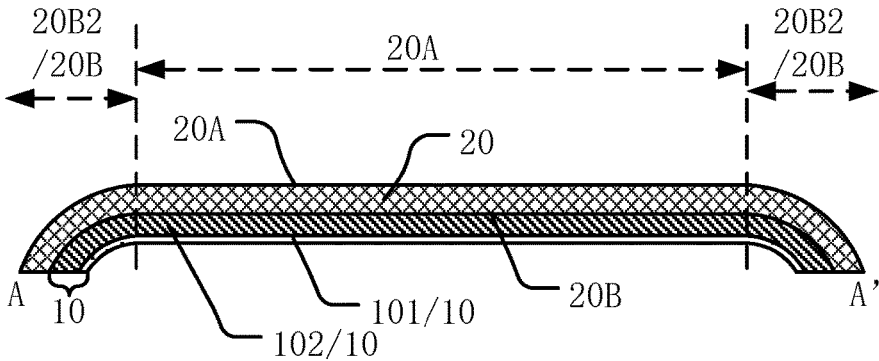
FIG. 23 illustrates another cross-sectional view along the AA' direction in FIG. 1, consistent with various disclosed embodiments of the present disclosure.
Figure 24:
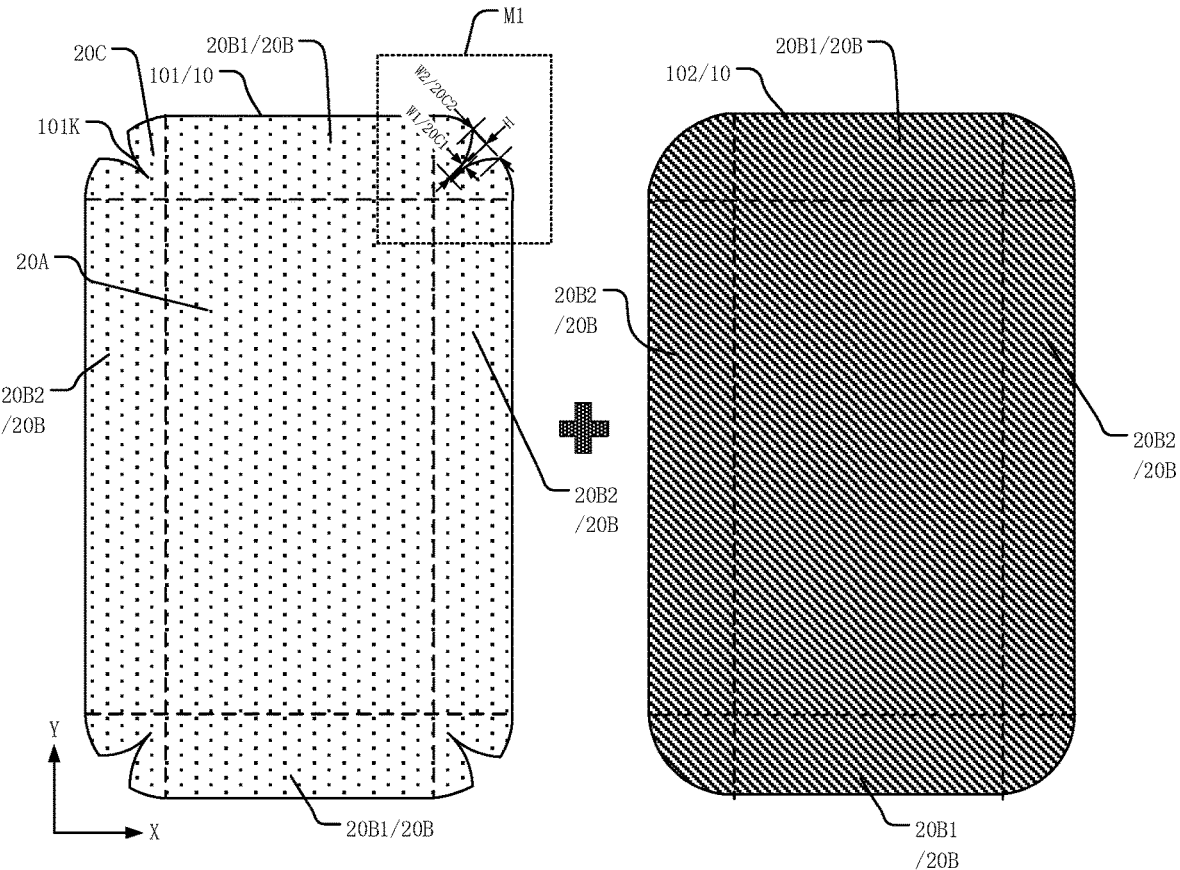
FIG. 24 illustrates a split planar structure of film layers in FIG. 1 and FIG. 23 before a composite layer is bonded with the display panel, consistent with various disclosed embodiments of the present disclosure.

In some embodiments shown in FIG. 1, FIG. 23 which is another cross-sectional view along the A-A' direction in FIG. 1, and FIG. 24 is a split view of the film layers before the composite layer is bonded with the display panel, the composite layer 10 may further include a first foam layer 102. The first foam layer 102 may be located on a side of the heat dissipation layer 101 facing the display panel 20. The first foam layer 102 may be a whole-surface structure covering the planar region 20A, the curved regions 20B and the corner regions 20C.

In the present embodiment, the composite layer 10 bonded to the backlight surface 20B of the display panel 20 may include the heat dissipation layer 101 and the first foam layer 102 on the side of the heat dissipation layer 101 facing the display panel 20. The first foam layer 102 may improve the cushioning effect of the composite layer 10. The first foam layer 102 may be a whole-surface structure covering the planar region 20A, the curved regions 20B, and the corner regions 20C. That is, although the heat dissipation layer 101 in the corner regions 20C includes the openings 101K, the first foam layer 102 may still be a whole-surface structure (as shown in FIG. 24, the shape of the first foam layer 102 is consistent with the shape of the display panel 20, and there is no opening in the corner regions 20C), to avoid affecting the overall-black light-blocking effect. Therefore, the heat dissipation layer 101 with the openings 101K in the corner regions 20C may achieve the effect of uniform heat dissipation and ensure the display when the display is turned on. Further, the first foam layer 102 with the whole-surface structure may also make the display module being able to achieve the overall-black effect in the off-screen state such that is not easy to distinguish the effect of the obvious border boundary.

Figure 25:
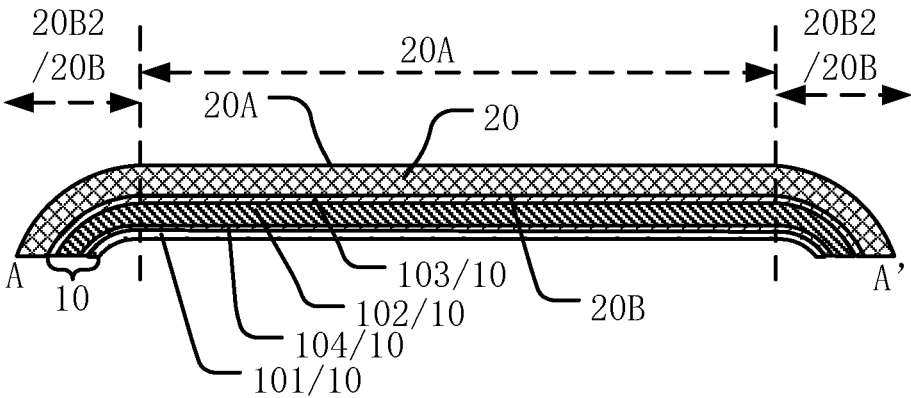
FIG. 25 illustrates another cross-sectional view along the AA' direction in FIG. 1, consistent with various disclosed embodiments of the present disclosure.
Figure 26:
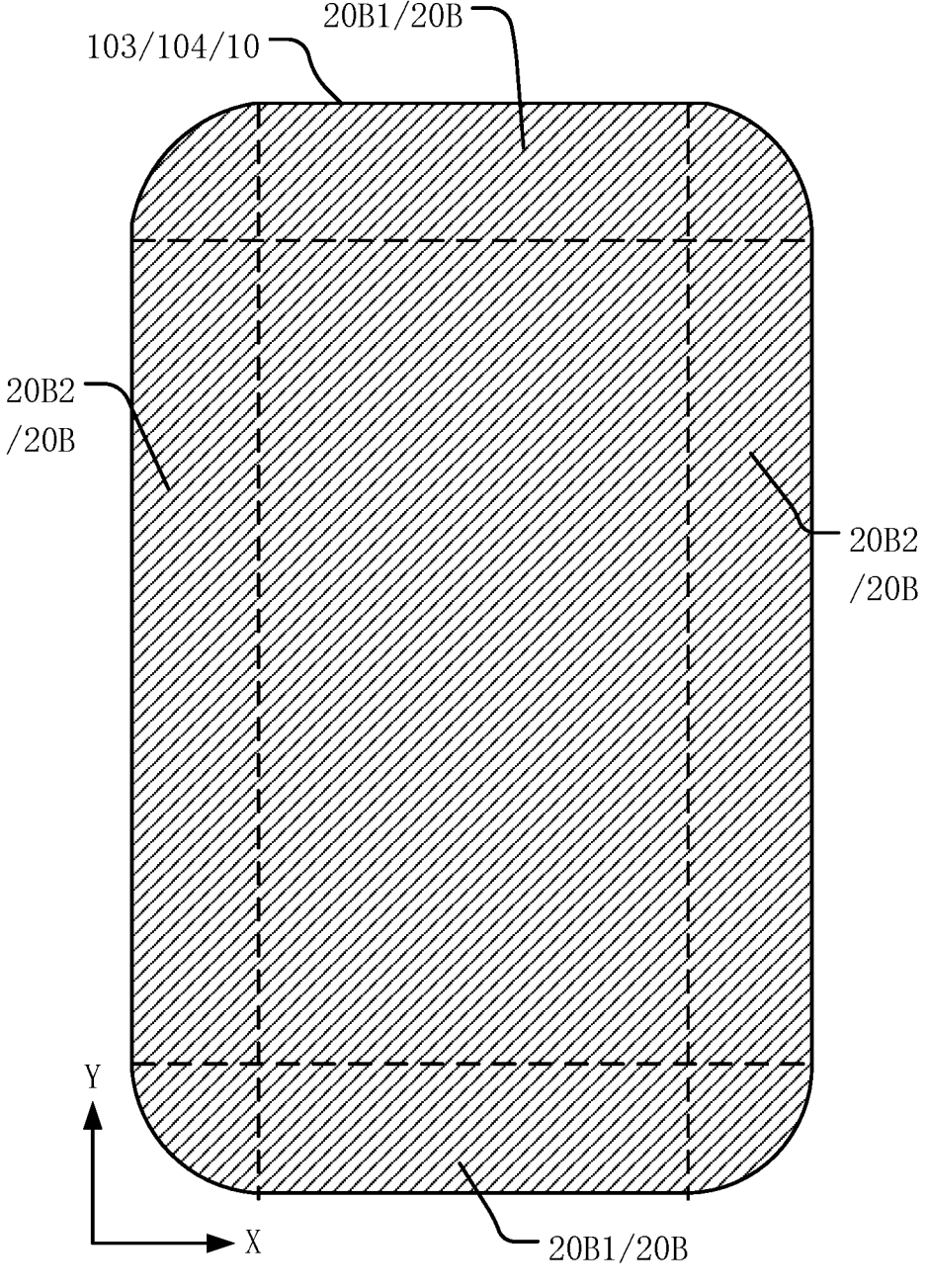
FIG. 26 illustrates a planar structure of an adhesive layer in FIG. 1 and FIG. 25 before a composite layer is bonded with the display panel, consistent with various disclosed embodiments of the present disclosure.

In some embodiments shown in FIG. 1, FIG. 25 which is another cross-sectional view along the A-A' direction in FIG. 1, and FIG. 26 is a planar structure of a first adhesive layer before the composite layer is bonded with the display panel, the composite layer 10 may also include a first adhesive layer 103 and a second adhesive layer 104. The first adhesive layer 103 may be located between the display panel 20 and the first foam layer 102, and the second adhesive layer 104 may be located between the heat dissipation layer 101 and the first foam layers 102. The first adhesive layer 103 and the second adhesive layer 104 may both be the whole-surface structure covering the planar region 20A, the curved regions 20B and the corner regions 20C.

In the present embodiment, the composite layer 10 bonded to the backlight surface 20B side of the display panel 20 may include the heat dissipation layer 101, the first foam layer 102, the first adhesive layer 103 between the display panel 20 and the first foam layer 102, and the second adhesive layer 104 between the heat dissipation layer 101 and the first foam layer 102. The first adhesive layer 103 may be used to realize the bonding and fixing between the composite layer 10 and the backlight surface of the display panel 20. The first adhesive layer 103 may be an adhesive layer including materials such as PET/PI, which not only makes the first adhesive layer 103 sticky but also protects the first foam by including materials such as PET/PI. The second adhesive layer 104 may be located between the heat dissipation layer 101 and the first foam layer 102, and may be used to realize the adhesion and fixation of the heat dissipation layer 101 and the first foam layer 102. In this embodiment, the first adhesive layer 103 and the second adhesive layer 104 may both be the whole-surface structure covering the planar region 20A, the curved regions 20B and the corner regions 20C (as shown in FIG. 26, the shapes of the first adhesive layer 103 and the second adhesive layer are consistent with the shape of the display panel 20, and do not include openings in the corner region 20C). That is, although the heat dissipation layer 101 in the corner regions 20C includes the openings 101K, the first foam layer 102, the first adhesive layer 103 and the second adhesive layer 104 may still have whole-surface structures, which not only prevents the first foam layer 102 from falling off, but also helps to ensure the whole-surface black effect in the corner regions 20C of the display panel 20 through the whole-surface structure of the above-mentioned light-shielding film layers.

Optionally, the heat dissipation layer 101 may be made of a material including a metal foil. When the heat dissipation layer 101 is a metal foil, it may be attached to the outermost side of the composite layer 10 away from the display panel 20. Therefore, the support, heat dissipation, and shielding of the display panel 20 may be achieved. Further, the hard heat dissipation layer 101 may be able to protect the screen body.

Figure 27:
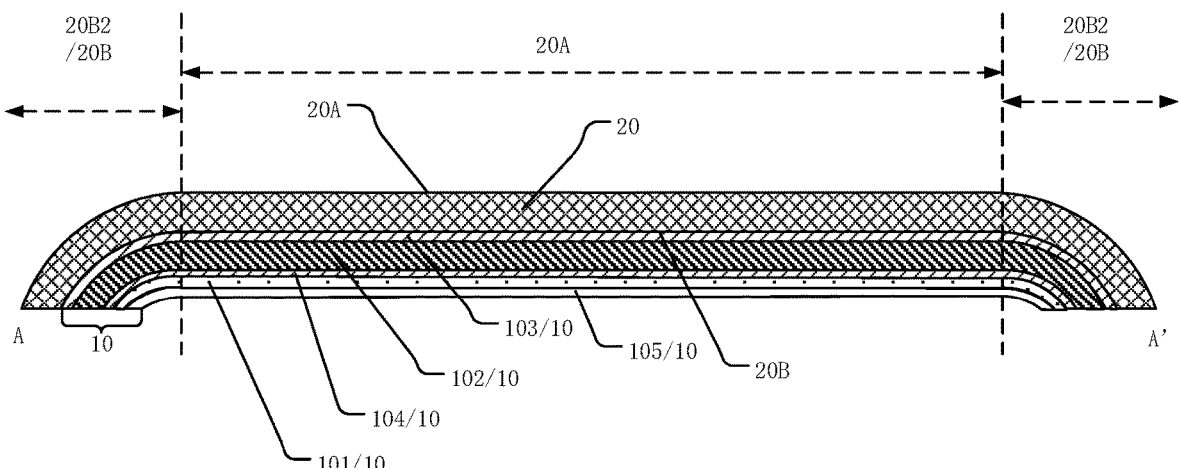
FIG. 27 illustrates another cross-sectional view along the AA' direction in FIG. 1, consistent with various disclosed embodiments of the present disclosure.

Optionally, in some other optional embodiments, as shown in FIG. 1 and FIG. 27 which is a schematic cross-sectional structure diagram of the AA' direction in FIG. 1, the heat dissipation layer 101 may be made of a material including a graphite sheet. At this time, the composite layer 10 may further include a second foam layer 105. The second foam layer 105 may be located on the side of the heat dissipation layer 101 away from the first foam layer 102. The second foam layer 105 may be used to protect the heat dissipation layer 101 of the graphite sheet. The second foam layer 105 located on the side of the heat dissipation layer 101 away from the first foam layer 102 may have same shape as the first foam layer 102, and may have a whole-surface structure covering the planar region 20A, the curved regions 20B and the corner regions 20C (It is not shown in the drawings, and can be understood with reference to the planar structure of the first foam layer 102). That is, although the heat dissipation layer 101 in the corner regions 20C includes the openings 101K, the first foam layer 102, the first adhesive layer 103, the second adhesive layer 104, and the second foam layer 105 may still have whole-surface structures, which not only prevents the second foam layer 105 from falling off, but also helps to ensure the whole-surface black effect in the corner regions 20C of the display panel 20 through the whole-surface structure of the above-mentioned light-shielding film layers.

When the composite layer 10 is bonded to the backlight surface 20B of the display panel 20, the first foam layer 102 may be adhered to the backlight surface 20B side of the display panel 20 through the first adhesive layer 103 first, and then the first foam layer 102 may be attached to the heat dissipation layer 101 through the second adhesive layer 104. When the heat dissipation layer 101 includes the second foam layer 105 on the side away from the first foam layer 102, another adhesive layer may also be used to attach the second foam layer 105 to the heat dissipation layer 101 to form the structure of the composite layer 10 on the side of the backlight surface 20B of the display panel 20. When the display module 000 is used, the composite layer 10 may achieve the functions of cooling the display panel 20 and shielding interference signals, to ensure the display quality of the display module 000 and also to ensure an integrated black effect when the screen is turned off.

Figure 28:
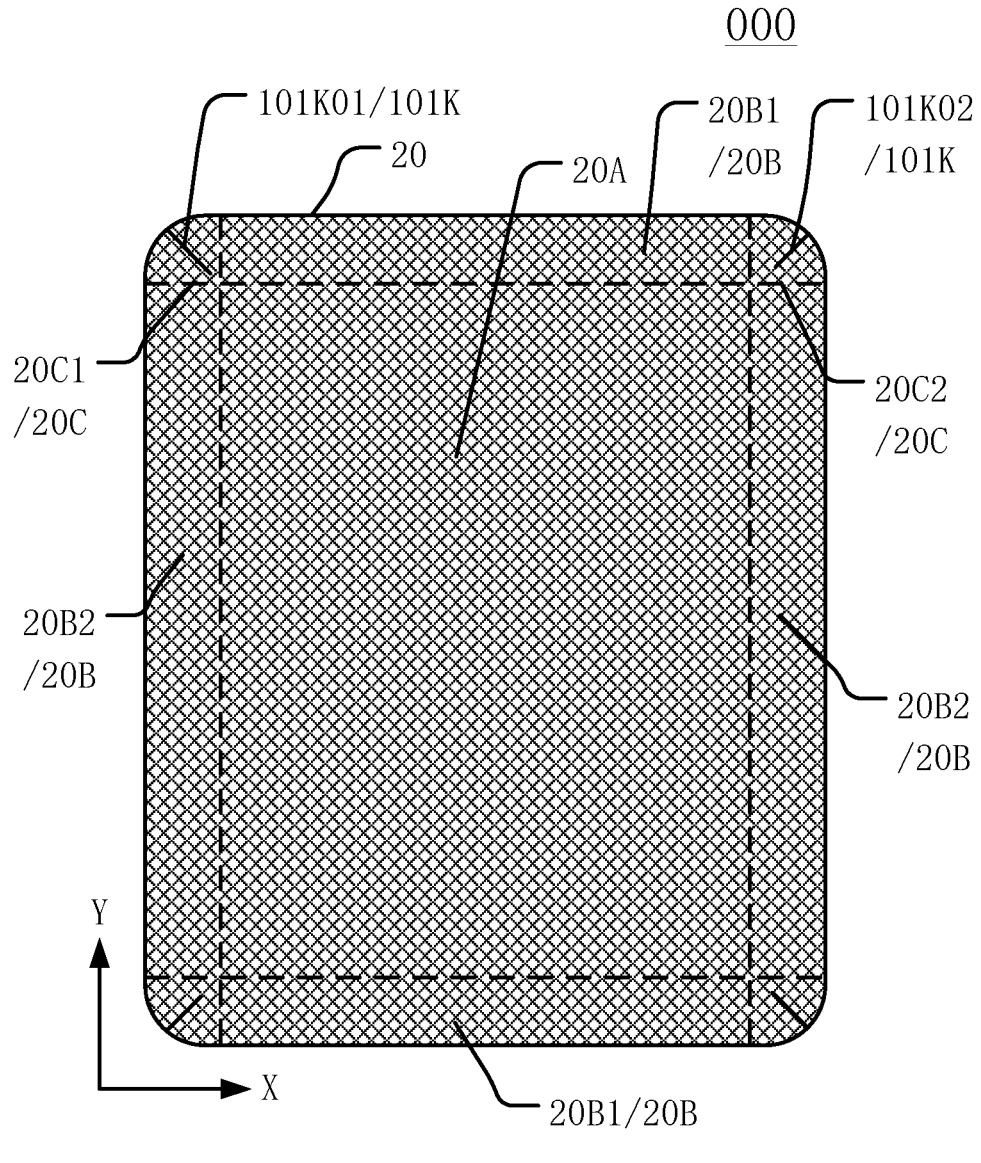
FIG. 28 illustrates another planar structure of a display module at a light-exiting side of a display panel consistent with various disclosed embodiments of the present disclosure.
Figure 29:
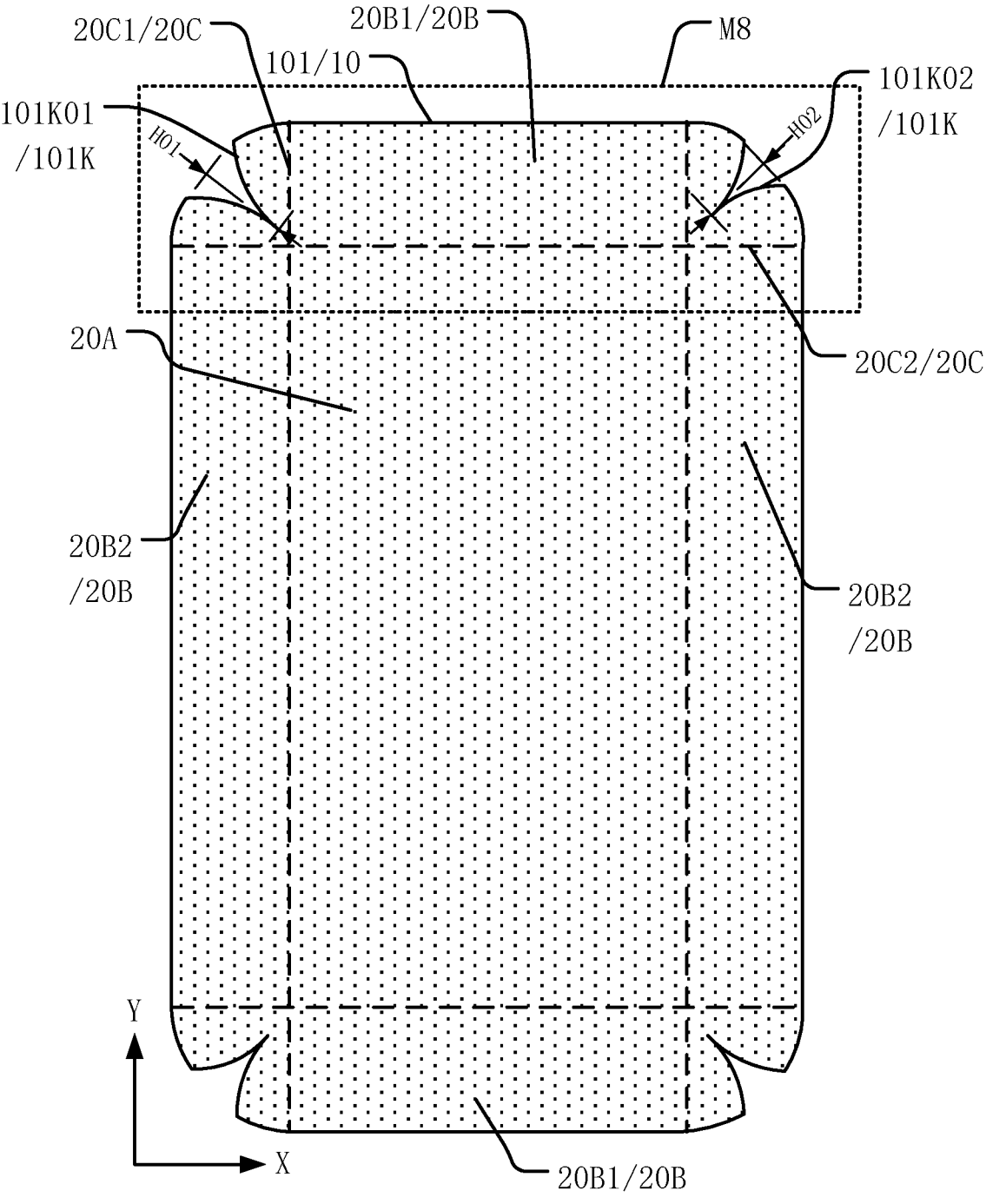
FIG. 29 illustrates a planar structure in FIG. 28 before a heat dissipation layer in a composite layer is bonded, consistent with various disclosed embodiments of the present disclosure.
Figure 30:
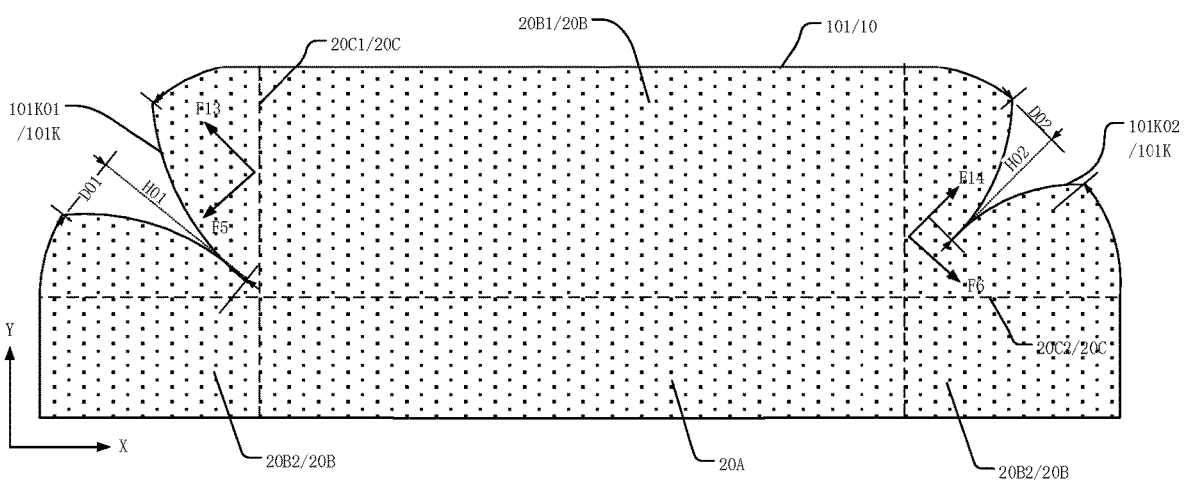
FIG. 30 illustrates a locally enlarged structure of an M8 region in FIG. 29, consistent with various disclosed embodiments of the present disclosure.

In some embodiments as shown in FIG. 28 which is another planar structure of the display module at the light-emitting side of the display panel, FIG. 29 which is a planar structure before the heat dissipation layer in the composite layer is bonded with the display panel, and FIG. 30 which is a locally enlarged view of the M8 region in FIG. 29, the plurality of corner regions 20C may at least include a first corner region 20C1 and a second corner region 20C2. One opening 101K in the first corner region 20C1 may be a first opening 101K01, and one opening 101K in the second corner region 20C2 may be a second opening 101K02. The length H01 of the first opening 101K01 in the extending direction of the first opening 101K01 (the direction F13 shown in FIG. 30) and the length H02 of the second opening 101K02 in the extending direction of the second opening 101K02 (the direction F14 shown in FIG. 30) may be different; and/or, the maximum value D01 of the width of the first opening 101K01 in the fifth direction F5 may be different from the maximum value D02 of the width of the second opening 101K02 in the sixth direction F6. The fifth direction F5 may be perpendicular to the extension direction of the first opening 101K01 (the direction F13 shown in FIG. 30), and the sixth direction F6 may be perpendicular to the extension direction of the second opening 101K02 (the direction F14 shown in FIG. 30).

Optionally, in one embodiment, the length H01 of the first opening 101K01 in the extending direction of the first opening 101K01 (the direction F13 shown in FIG. 30) may be larger than the length H02 of the second opening 101K02 in the extending direction of the second opening 101K02 (the direction F14 shown in FIG. 30), and the maximum value D01 of the width of the first opening 101K01 in the fifth direction F5 may be equal to the maximum value D02 of the width of the second opening 101K02 in the sixth direction F6.

Optionally, in another embodiment, the maximum value D01 of the width of the first opening 101K01 in the fifth direction F5 may be larger than the maximum value D02 of the width of the second opening 101K02 in the sixth direction F6. The fifth direction F5 may be perpendicular to the extension direction of the first opening 101K01 (the direction F13 shown in FIG. 30), and the sixth direction F6 may be perpendicular to the extension direction of the second opening 101K02 (the direction F14 shown in FIG. 30). The length H01 of the first opening 101K01 in the extending direction of the first opening 101K01 (the direction F13 shown in FIG. 30) may be equal to the length H02 of the second opening 101K02 in the extending direction of the second opening 101K02 (the direction F14 shown in FIG. 30).

Optionally, in one embodiment, the length H01 of the first opening 101K01 in the extending direction of the first opening 101K01 (the direction F13 shown in FIG. 30) may be larger than the length H02 of the second opening 101K02 in the extending direction of the second opening 101K02 (the direction F14 shown in FIG. 30), and the maximum value D01 of the width of the first opening 101K01 in the fifth direction F5 may be larger than the maximum value D02 of the width of the second opening 101K02 in the sixth direction F6. The fifth direction F5 may be perpendicular to the extension direction of the first opening 101K01 (the direction F13 shown in FIG. 30), and the sixth direction F6 may be perpendicular to the extension direction of the second opening 101K02 (the direction F14 shown in FIG. 30).

In the present embodiment, the display panel 20 may include the plurality of corner regions 20C. For example, the display panel 20 may include four corner regions 20C. The plurality of corner regions 20C may at least include a first corner region 20C1 and a second corner region 20C2. One opening 101K in the first corner region 20C1 may be named as a first opening 101K01, and one opening 101K in the second corner region 20C2 may be named as a second opening 101K02. At least one of the length and the maximum width of the first opening 101K01 may be different from the second opening 101K02. The embodiment shown in FIG. 29 and FIG. 30 where the length H01 of the first opening 101K01 in the extending direction of the first opening 101K01 is larger than the length H02 of the second opening 101K02 in the extending direction of the second opening 101K02 and the maximum value D01 of the width of the first opening 101K01 in the fifth direction F5 is larger than the maximum value D02 of the width of the second opening 101K02 in the sixth direction F6 is used as an example to illustrate the present disclosure. The length and/or maximum width of the openings in different corner regions 20C may be designed differently. When the heat dissipation layer 101 is bonded to the backlight surface of the display panel 20, the heat dissipation layer 101 at the position of the first corner region 20C1 may be bonded first. Since the length H01 of the first opening 101K01 is relatively large and the maximum width D01 is relatively wide in the first corner region 20C1, the bonding difficulty between the heat dissipation layer 101 and the display panel 20 in the first corner region 20C1 as the initial bonding corner may be reduced, and the bonding yield of the initial step may be higher. After the heat dissipation layer 101 in the first corner region 20C1 is bonded to the display panel 20, the film bonding process of the second corner region 20C2 may be performed. The bonding difficulty of the overall film layers may be reduced, further improving process efficiency.

Figure 31:
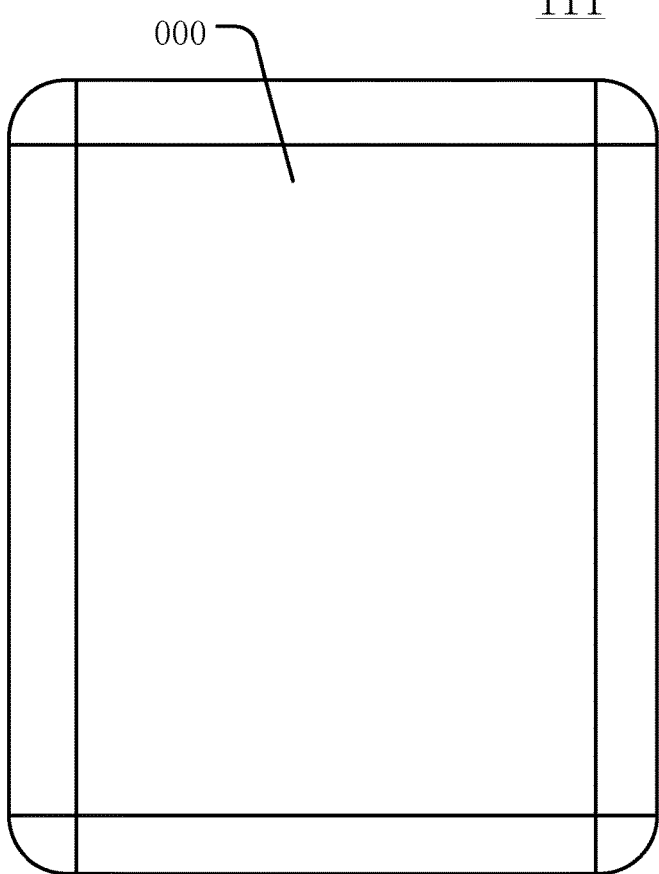
FIG. 31 illustrates an exemplary display device consistent with various disclosed embodiments of the present disclosure.

The present disclosure also provides a display device. As shown in FIG. 31, in one embodiment, the display device 111 may include any display module 000 provided by various embodiments of the present disclosure. The embodiment in FIG. 31 where the display device 000 is a cell phone is used as an example only to illustrate the present disclosure, and does not limit the scope of the present disclosure. In various embodiments, the display device 111 may be any display device with a display function, such as a computer, a television, a vehicle display device. The present disclosure has no limit on this. The display device provided by the present disclosure may have advantages same as the display panels provided by the present disclosure.

In the display module and display device provided by various embodiments of the present disclosure, the display module may be a curved screen, and may include a display panel and a composite layer. The display panel may be used to realize the display effect of the display module. The composite layer bonded to the backlight surface of the display panel may support the display panel. The composite layer may at least include the heat dissipation layer and may be bonded to the backlight side of the display panel, which may dissipate heat and shield interference signals when the display module is in use, to ensure the display quality of the display module. The display panel may include a planar region, a plurality of curved regions and a plurality of corner regions. The plurality of curved regions may be at least partially disposed around the planar region, and the plurality of corner regions may be disposed at corners where the plurality of curved regions surrounds the planar region. The heat dissipation layer may include at least one opening at one of the plurality of corner regions. The opening may extend along the first direction, and may have a structure whose width in the second direction is smaller when being closer to the planar region and is larger when being farther away from the planar region. At the half-length position of the opening, the width of the opening in the second direction may be less than half of the maximum value of the width of the opening in the second direction. Therefore, in the first direction and along the direction from the corner region pointing to the planar region, the width of the opening in the second direction may tend to become narrower at an accelerated rate. The edges of the opening in the heat dissipation layer in the corner region may be arc-shaped, and the shape of the orthographic projection of the opening on the light-emitting surface of the display module may be a trumpet shape, such that the heat dissipation layer in the corner region may be prevented from being squeezed by forces in different directions when the heat dissipation layer is bonded to the backlight side of the display panel. Therefore, buckling after bonding may be prevented even when the heat dissipation layer has a large elastic modulus and a poor ductility. Correspondingly, the formation of wrinkles or air bubbles between the heat dissipation layer and the display panel may be prevented, and the bonding yield may be improved, reducing the difficulty of bonding. Further, after the heat dissipation layer is attached to the backlight surface of the display panel, the arc edges of the trumpet-shaped opening in the corner region may follow the curved surface shape of the corner region, such that the arc edges of the opening may be merged as much as possible. Therefore, uneven heat dissipation of the display panel in the corner region because of the formation of gaps between the curved edges of the opening after bonding, may be prevented. After the heat dissipation layer at the corner is bonded to the display panel, the uniformity of heat dissipation may be ensured, improving the display quality.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display module, comprising a display panel and a composite layer, wherein:
   the composite layer is located on a backlight side of the display panel;
   the composite layer at least includes a heat dissipation layer;
   the display panel includes a planar region, a plurality of curved regions and a plurality of corner regions;
   the plurality of curved regions is at least partially arranged around the planar region;
   the plurality of corner regions is disposed at corners of the plurality of curved regions around the planar region;
   in one corner region of the plurality of corner regions, the heat dissipation layer includes at least one opening, and the at least one opening extends along a first direction;
   the corner region includes a first position and a second position located at a side of the first position away from the planar region;
   a width of the at least one opening in a second direction at the first position is smaller than a width of the at least one opening at the second position in the second direction, wherein the second direction is perpendicular to the first direction;
   a length of the at least one opening in the first direction is H;
   at 1/2H, the width of the at least one opening in the second directions is D2, and the maximum width of the at least one opening in the second direction is D1;
   wherein D2<0.5D1;
   in the corner region, the heat dissipation layer includes a first edge and a second edge forming the at least one opening;
   at an intersection of the first edge and the second edge, the heat dissipation layer in the corner region includes a crack relief opening; and
   along the first direction, a width of the crack relief opening in the second direction gradually increases and the width of the crack relief opening in the second direction is larger when being closer to the planar region; or the crack relief opening includes a crack relief edge and the curvature of the crack relief edge gradually increases in the first direction, wherein the curvature of the crack relief edge is larger when being closer to the planar region.

2. The display module according to claim 1, wherein:
   one corner region of the plurality corner regions includes a plurality of openings;
   the plurality of openings at least includes a first-level opening and a second-level opening;
   a length H1 of the first-level opening in an extending direction of the first-level opening is different from a length H2 of the second-level opening in an extending direction of the second-level opening; and/or
   a maximum value D11 of the width of the first-level opening in a third direction is different from a maximum value D12 of the second-level opening in a fourth direction, wherein the third direction is perpendicular to the extending direction of the first-level opening and the fourth direction is perpendicular to the extending direction of the second-level opening.

3. The display module according to claim 2, wherein:
   the corner region includes one first-level opening and at least two second-level openings, and the first-level opening is located between the at least two second-level openings along the second direction.

4. The display module according to claim 2, wherein H1>H2.

5. The display module according to claim 2, wherein D11>D12.

6. The display module according to claim 2, wherein H1>H2 and D11>D12.

7. The display module according to claim 2, wherein:

at 1/2H1, the width of the first-level opening in the third direction is D21;

at 1/2H2, the width of the second-level opening in the fourth direction is D22; and

D21<D22.

8. The display module according to claim 2, wherein:

in the corner region, the heat dissipation layer includes a third edge and a fourth edge forming the first-level opening;

along the extension direction of the first-level opening, the third edge and the fourth edge meet at a first apex;

in the corner region, the heat dissipation layer includes a fifth edge and a sixth edge forming the second-level opening;

along the extension direction of the second-level opening, the fifth edge and the sixth edge intersect at a second vertex; and the first vertex and the second vertex are located at different positions of the corner region.

9. The display module according to claim 8, wherein:

the third edge and the fourth edge are symmetrical to each other along a first symmetric axis;

the fifth edge and the sixth edge are symmetrical to each other along a second symmetric axis; and the first symmetric axis and the second symmetric axis do not intersect.

10. The display module according to claim 1, wherein:

in one corner region of the plurality of corner regions, the heat dissipation layer further includes a hollow part; and along the first direction, the hollow part is located at a side of the opening close to the planar region.

11. The display module according to claim 10, wherein:

in the corner region, the heat dissipation layer includes a first sub-edge forming the opening;

the hollow part includes a second sub-edge facing the opening; and a shape of the second sub-edge is the same as a shape of the first sub-edge.

12. The display module according to claim 11, wherein:

the hollow part includes a third sub-edge and a fourth sub-edge respectively connected to two ends of the second sub-edge, and the third sub-edge and the fourth sub-edge include any one of a straight line or a curve.

13. The display module according to claim 1, wherein:

the composite layer further includes a first foam layer on a side of the heat dissipation layer facing the display panel; and the first foam layer has a whole-surface structure covering the planar region, the plurality of curved regions, and the plurality of corner regions.

14. The display module according to claim 13, wherein:

the composite layer further includes a first adhesive layer and a second adhesive layer;

the first adhesive layer is located between the display panel and the first foam layer;

the second adhesive layer is located between the heat dissipation layer and the first foam layer; and both the first adhesive layer and the second adhesive layer have whole-surface structures covering the planar region, the plurality of curved regions, and the plurality of corner regions.

15. The display module according to claim 1, wherein:

the plurality of corner regions at least include a first corner region and a second corner region;

one opening in the first corner region is a first opening, and one opening in the second corner region is a second opening;

a length H01 of the first opening in an extending direction of the first opening is different from a length H02 of the second opening in an extending direction of the second opening; and/or, a maximum value D01 of a width of the first opening in a fifth direction is different from a maximum value D02 of a width of the second opening in a sixth direction, wherein the fifth direction is perpendicular to the extending direction of the first opening and the sixth direction is perpendicular to the extending direction of the second opening.

16. The display module according to claim 15, wherein H01>H02.

17. The display module according to claim 15, wherein D01>D02.

18. The display module according to claim 15, wherein H01>H02 and D01>D02.

19. A display device, comprising a display module including a display panel and a composite layer, wherein:

the composite layer is located on a backlight side of the display panel;

the composite layer at least includes a heat dissipation layer;

the display panel includes a planar region, a plurality of curved regions and a plurality of corner regions;

the plurality of curved regions is at least partially arranged around the planar region;

the plurality of corner regions is disposed at corners of the plurality of curved regions around the planar region;

in one corner region of the plurality of corner regions, the heat dissipation layer includes at least one opening, and the at least one opening extends along a first direction;

the corner region includes a first position and a second position located at a side of the first position away from the planar region;

a width of the at least one opening in a second direction at the first position is smaller than a width of the at least one opening at the second position in the second direction, wherein the second direction is perpendicular to the first direction;

a length of the at least one opening in the first direction is H;

at 1/2H, the width of the at least one opening in the second directions is D2, and the maximum width of the at least one opening in the second direction is D1;

wherein D2<0.5D1;

in the corner region, the heat dissipation layer includes a first edge and a second edge forming the at least one opening;

at an intersection of the first edge and the second edge, the heat dissipation layer in the corner region includes a crack relief opening; and along the first direction, a width of the crack relief opening in the second direction gradually increases and the width of the crack relief opening in the second direction is larger when being closer to the planar region; or the crack relief opening includes a crack relief edge and the curvature of the crack relief edge gradually increases in the first direction, wherein the curvature of the crack relief edge is larger when being closer to the planar region.

* * * * *